(12) United States Patent
Su et al.

(10) Patent No.: US 9,867,309 B2
(45) Date of Patent: Jan. 9, 2018

(54) DIVIDER WALLS FOR INFORMATION HANDLING SYSTEM CHASSIS ENCLOSURES

(71) Applicants: Iou Ren Su, Keelung (TW); Ying Hsien Tseng, Taipei (TW); Chun Yang Tseng, Taiwan (TW); Richard D. Trotta, Pflugerville, TX (US); Brandon J. Brocklesby, Pflugerville, TX (US)

(72) Inventors: Iou Ren Su, Keelung (TW); Ying Hsien Tseng, Taipei (TW); Chun Yang Tseng, Taiwan (TW); Richard D. Trotta, Pflugerville, TX (US); Brandon J. Brocklesby, Pflugerville, TX (US)

(73) Assignee: Dell Products LP, Round Rock, TX (US)

(*) Notice: Subject to any disclaimer, the term of this patent is extended or adjusted under 35 U.S.C. 154(b) by 13 days.

(21) Appl. No.: 15/157,092

(22) Filed: May 17, 2016

(65) Prior Publication Data
US 2017/0339799 A1 Nov. 23, 2017

(51) Int. Cl.
*H05K 7/14* (2006.01)
*H05K 5/02* (2006.01)
*A47B 96/04* (2006.01)

(52) U.S. Cl.
CPC ........... *H05K 7/1489* (2013.01); *A47B 96/04* (2013.01); *H05K 5/02* (2013.01); *H05K 7/1487* (2013.01)

(58) Field of Classification Search
CPC ....... H05K 5/02; H05K 7/1487; H05K 7/1489
USPC ................................ 312/223.2, 265.5, 265.6
See application file for complete search history.

(56) References Cited

U.S. PATENT DOCUMENTS

| | | | | |
|---|---|---|---|---|
| 2,148,681 | A * | 2/1939 | Cameron | A01K 41/065 119/322 |
| 2,214,042 | A * | 9/1940 | Burdick | A47B 88/20 220/543 |
| 3,453,789 | A * | 7/1969 | Stephenson | E04B 2/822 52/126.3 |
| 3,650,588 | A * | 3/1972 | Helland | A47B 57/20 211/126.15 |
| 3,710,974 | A * | 1/1973 | Hage | A47B 88/20 211/51 |
| 4,188,148 | A * | 2/1980 | Waibel | F16B 5/0614 403/256 |
| 4,518,278 | A * | 5/1985 | Koch | F16B 12/2036 403/230 |

(Continued)

*Primary Examiner* — Daniel J Troy
*Assistant Examiner* — Timothy M Ayres
(74) *Attorney, Agent, or Firm* — Egan Peterman Enders Huston

(57) ABSTRACT

Apparatus and methods that employ divider walls that are configured for insertion and proper positioning within a cavity of an information handling system chassis enclosure in a mechanically non-interfering manner prior to securement of the divider wall in a fixed position within the cavity. A divider wall may be provided that is shorter than the height of a corresponding chassis enclosure cavity to allow the divider wall to be freely inserted and fixed in position within the chassis cavity in perpendicular relationship between two opposing cavity interior surfaces without any resulting compressive forces being applied to the respective ends of the divider wall by the opposing interior surfaces of the chassis enclosure cavity.

20 Claims, 19 Drawing Sheets

(56) References Cited

U.S. PATENT DOCUMENTS

| | | | | |
|---|---|---|---|---|
| 5,265,993 | A * | 11/1993 | Wayne | B60P 7/14 220/500 |
| 5,368,426 | A * | 11/1994 | Reeves | F16B 12/46 403/205 |
| 5,377,467 | A * | 1/1995 | Barnavol | E04B 2/825 52/238.1 |
| 5,806,941 | A * | 9/1998 | Diederich | B42F 17/14 220/542 |
| 6,612,087 | B2 * | 9/2003 | diGirolamo | E04B 2/767 403/403 |
| 6,719,480 | B1 * | 4/2004 | Janatka | F16B 5/0291 403/373 |
| 6,991,307 | B2 * | 1/2006 | Hoenig | A47B 88/20 211/184 |
| 7,597,500 | B2 * | 10/2009 | Gernez | F16B 2/065 403/22 |
| 8,162,559 | B2 * | 4/2012 | Krige | A47B 47/0025 108/193 |
| 8,186,917 | B2 * | 5/2012 | Nelson | B60P 3/205 410/129 |
| 8,210,622 | B2 * | 7/2012 | Forrest | A47B 96/04 211/184 |
| 8,982,565 | B2 * | 3/2015 | Sherrod | H05K 7/1488 248/155.5 |
| 8,995,120 | B2 | 3/2015 | Kwon | |
| 9,167,716 | B2 | 10/2015 | Ma et al. | |
| 2008/0013273 | A1 * | 1/2008 | Bailey | G06F 1/185 361/679.33 |

* cited by examiner

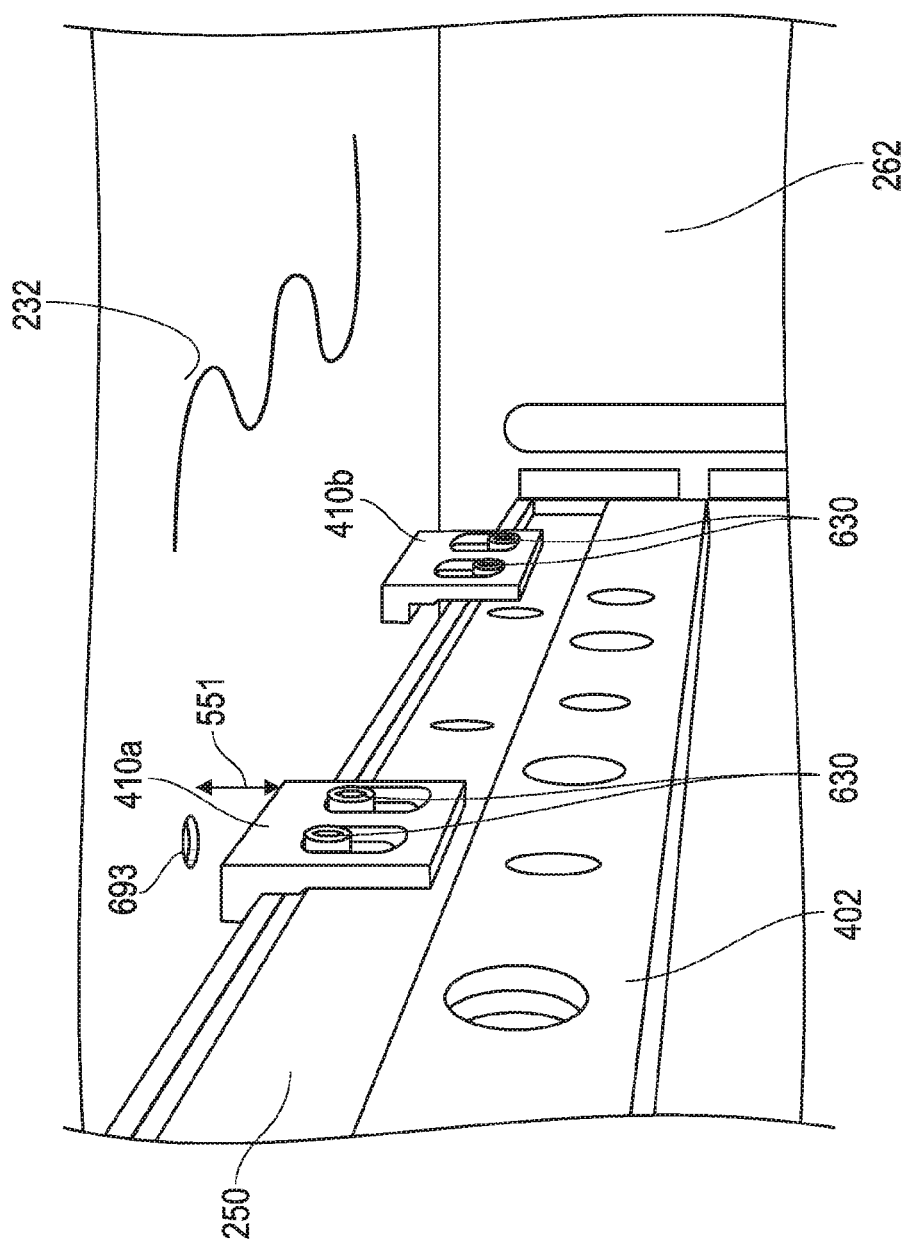

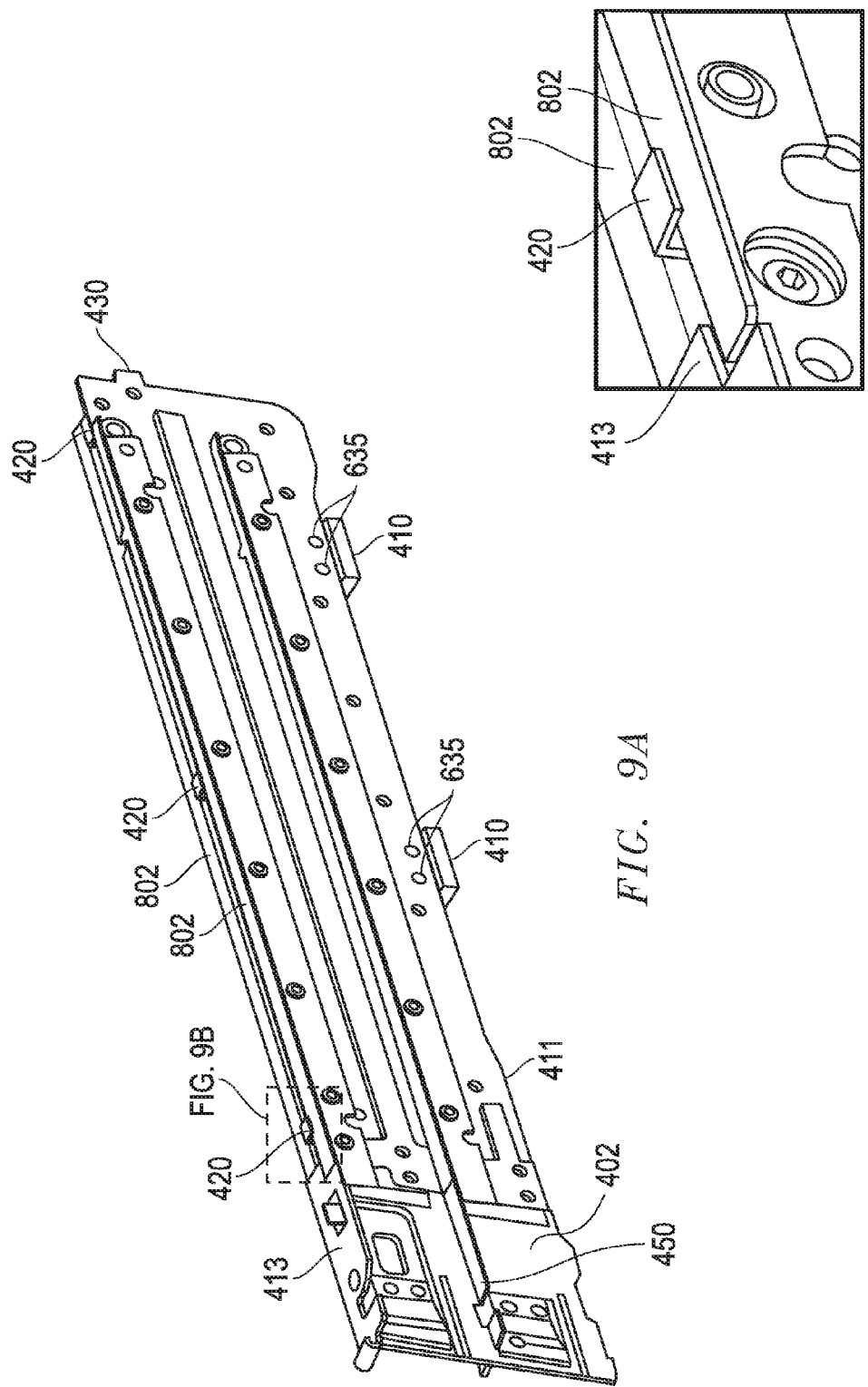

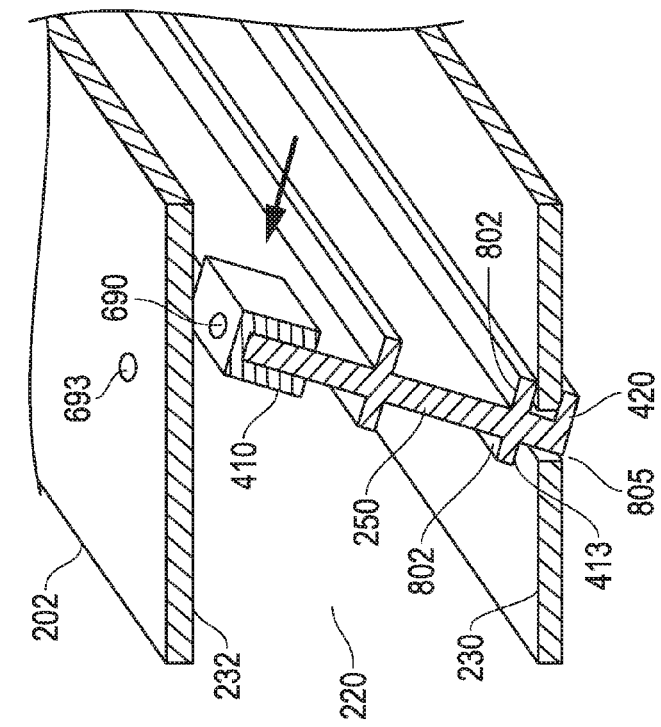
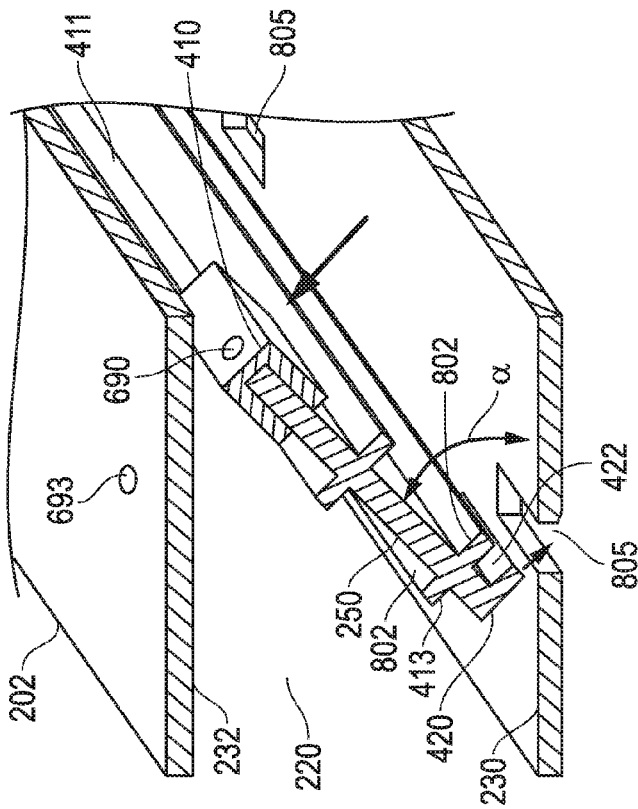
FIG. 10A
FIG. 10B

DIVIDER WALLS FOR INFORMATION HANDLING SYSTEM CHASSIS ENCLOSURES

TECHNICAL FIELD

This application relates to information handling system chassis and, more particularly, to divider wall walls for information handling system chassis enclosures.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

FIG. 1 illustrates a front sectional view of a conventional rack mount chassis enclosure 100 showing a conventional divider wall 102 placed within the interior cavity 120 of the chassis enclosure 100. The conventional divider wall 102 has a height "D" that is equal to the height "C" of chassis enclosure interior cavity 120 such that the first end of divider wall 102 contacts the top interior surface 130 of chassis enclosure 100 and the and the second end of divider wall 102 contacts the bottom interior surface 132 of chassis enclosure 100 when divider wall 102 is inserted and rotated within chassis enclosure 120 to a position that is parallel to the plane of the chassis enclosure surfaces as shown. During insertion and rotation of divider wall 102, this contact with chassis enclosure surfaces 130 and 132 may cause the divider wall 102 to bow or deflect due to compressional force/s that are applied to divider wall 102 when the top and second ends of the divider wall 102 mechanically contact the corresponding top and bottom interior surfaces 130 and 132 of enclosure cavity 120.

Since it is equal in height to the interior height of cavity 120, conventional divider wall 102 must be inserted and/or rotated within cavity 120 to a position that is perpendicular to the plane of surfaces 130 and 132, while at the same time being slid into position where threaded fastener holes 104 defined in upper and lower ends of divider 102 are aligned with corresponding fastener holes 108 defined in the upper and lower sides of chassis enclosure 100 as shown. When so aligned, a separate screw 106 is inserted into each chassis enclosure fastener hole 108 in the direction of the arrows and threaded into the corresponding aligned divider wall threaded fastener hole 104 to secure the divider wall in place within chassis enclosure cavity 120 and to prevent sideways deflection of the divider wall 102 after installation. During such installation of conventional divider wall 102 into chassis enclosure cavity 120, it is often difficult to align each of the divider wall threaded fastener holes 104 with a corresponding chassis enclosure fastener hole 108 since the positional relationship between the respective holes 104 and 108 is visually obscured by the presence of the inserted divider wall 102, and since no gap exists between the divider wall ends and the chassis enclosure when divider wall 102 is positioned within the chassis enclosure in perpendicular relationship to the plane of chassis cavity interior surfaces 130 and 132.

SUMMARY

Disclosed herein are apparatus and methods that employ divider walls that are configured for insertion and proper positioning within a cavity of an information handling system chassis enclosure in a mechanically non-interfering manner prior to securement of the divider wall in a fixed position within the cavity. In one embodiment, a divider wall may be provided that is shorter than the height of a corresponding chassis enclosure cavity to allow the divider wall to be freely inserted and fixed in position within the chassis cavity in perpendicular relationship between two opposing cavity interior surfaces without any resulting compressive forces being applied to the respective ends of the divider wall by the opposing interior surfaces of the chassis enclosure cavity.

In one embodiment, a switchable divider wall may be provided that includes at least one floating extension (e.g., cap) provided on a first end of the divider wall that is configured to remain retracted toward the first end of the divider wall end during installation of the divider wall into a chassis cavity to ensure that an open gap (with no contact) is preserved between one or both ends of the divider wall and respective corresponding interior surface/s of the cavity during positioning of the divider wall within the cavity. After positioning of the divider wall within the cavity in perpendicular relationship between opposing cavity interior surfaces, the floating extension may then be extended outwardly from the first end of the divider wall toward a corresponding first interior surface of the cavity to which it may then be secured, e.g., by a fastener such as screw, threaded bolt, etc. In a further embodiment, a fixed connector in the form of fixed extension (e.g., such as hook, etc.) may be provided on a second end of the divider wall that is opposite from the floating extension. The divider wall may be first positioned to engage or otherwise connect or anchor the fixed connector to the second interior surface of the cavity, e.g., by engaging a fixed extension on the second end of the divider wall to a corresponding anchor opening defined within the second interior surface of the cavity prior to extending the floating extension from the first end of the divider wall to secure the floating extension to the first interior surface of the cavity.

In one embodiment, a switchable divider wall may be properly positioned within a chassis enclosure cavity in a mechanically non-interfering manner that allows for easy visual or by-touch alignment of divider wall components with corresponding anchor openings and/or fastener holes defined within corresponding interior surface/s of the cavity by virtue of an open gap (with no contact) that may be preserved between one or both ends of the divider wall and the opposing interior surface/s of the cavity during positioning of the divider wall within the cavity in perpendicular relationship with the plane of the interior surfaces of the cavity. Further, since a height of the divider wall is less than the height of the chassis enclosure cavity, the divider wall may be inserted and so positioned within a corresponding chassis enclosure cavity without being subjected to compressional forces and/or bending or bowing due to mechanical contact with interior surfaces of the chassis enclosure cavity. The disclosed apparatus and methods may be advantageously employed to more easily configure or reconfigure individual chassis enclosures with custom divider wall configurations to fit particular custom builds or model types, e.g., in the field or at the factory or other type of information handling system assembly facility.

In one respect, disclosed herein is a method of installing a divider wall assembly within a cavity of a chassis enclosure that is defined between a first side and a second side of the chassis enclosure. The method may include: positioning a divider wall of the divider wall assembly within the cavity of the chassis enclosure in perpendicular orientation to a plane of a first side and a second side of the chassis enclosure with at least one floating extension coupled to a first end of the divider wall in retracted position so as to create an open gap between a first end of the divider wall and a first side of the chassis enclosure and so as to create an open gap between a first end of the retracted floating extension and the first side of the chassis enclosure; and then raising the at least one floating extension to an extended position to contact and secure the first end of the divider wall to the first side of the chassis enclosure.

In another respect, disclosed herein is a chassis enclosure, including: first and second sides defining a chassis enclosure cavity therebetween; a divider wall assembly disposed within the cavity of the chassis enclosure in perpendicular orientation to a plane of a first side and a second side of the chassis enclosure, the divider wall having a first end and a second end, and a height of the divider wall between the first end and second end of the divider wall being less than a height of the chassis enclosure cavity so as to create an open gap between the first end of the divider wall and the first side of the chassis enclosure; and at least one floating extension coupled to extend from the first end of the divider wall and configured to remain in a retracted position closer to the first end of the divider wall during insertion of the divider wall assembly into the chassis cavity such that no contact occurs between the first side of the chassis enclosure and either the floating extension or the first end of the divider wall when the divider wall assembly is positioned in perpendicular orientation to the plane of the first side and the second side of the chassis enclosure. The floating extension may be raised to its extended position to contact and secure the first end of the divider wall to the first side of the chassis enclosure with the divider wall assembly is positioned in perpendicular orientation to the plane of the first side and the second side of the chassis enclosure.

In another respect, disclosed herein is a divider wall assembly configured to be received within a cavity of a chassis enclosure in perpendicular orientation to a plane of a first side and a second side of the chassis enclosure that define the chassis enclosure cavity. The divider wall assembly may include: a divider wall having a first end and a second end, a height of the divider wall between the first end and second end being less than a height of the chassis enclosure cavity defined between the first side and second side of the chassis enclosure so as to create an open gap between the first end of the divider wall and a first side of the chassis enclosure when the divider wall is positioned in perpendicular orientation to the plane of a first side and a second side of the chassis enclosure; and at least one floating extension coupled to extend from the first end of the divider wall and configured to remain in a retracted position closer to the first end of the divider wall during insertion of the divider wall assembly into the chassis cavity such that no contact occurs between the first side of the chassis enclosure and either the floating extension or the first end of the divider wall when the divider wall assembly is positioned in perpendicular orientation to the plane of the first side and the second side of the chassis enclosure. The floating extension may be configured to be raised to its extended position to contact and secure the first end of the divider wall to the first side of the chassis enclosure after the divider wall assembly is positioned in perpendicular orientation to the plane of the first side and the second side of the chassis enclosure.

BRIEF DESCRIPTION OF THE DRAWINGS

FIG. 5 illustrates a partial front perspective view of a divider wall according to one exemplary embodiment of the disclosed apparatus and methods.

FIG. 9A illustrates a side perspective view of a divider wall component according to one exemplary embodiment of the disclosed apparatus and methods.

FIG. 9B illustrates an enlarged view of a portion of the divider wall component of FIG. 9A according to one exemplary embodiment of the disclosed apparatus and methods.

FIG. 10A illustrates a partial front perspective view of a divider wall and chassis enclosure cavity according to one exemplary embodiment of the disclosed apparatus and methods.

FIG. 10B illustrates a partial front perspective view of a divider wall and chassis enclosure cavity according to one exemplary embodiment of the disclosed apparatus and methods.

DESCRIPTION OF ILLUSTRATIVE EMBODIMENTS

Figure 1:
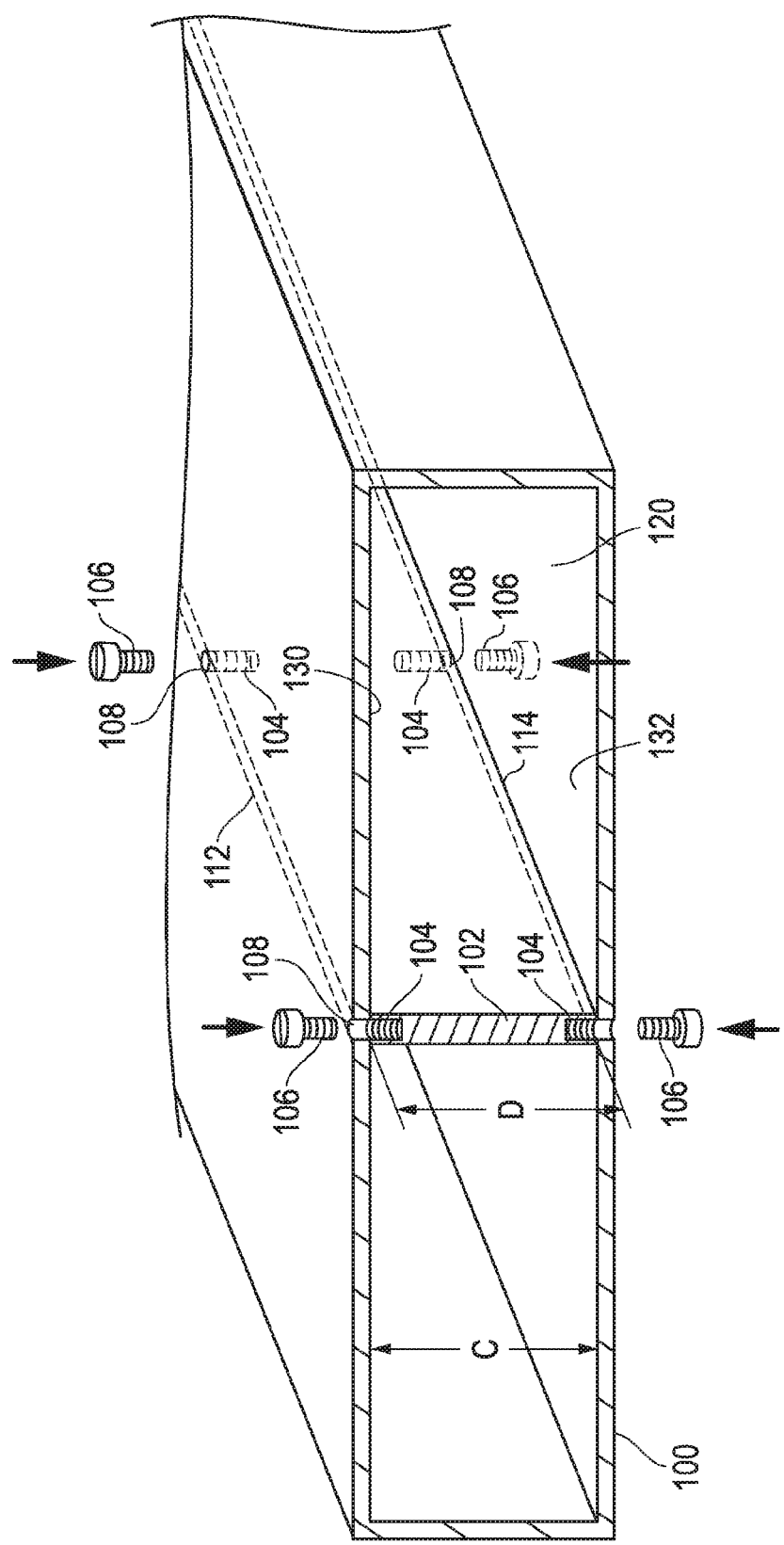
FIG. 1 illustrates a front perspective view of a conventional divider wall positioned within a chassis enclosure cavity.
Figure 2:
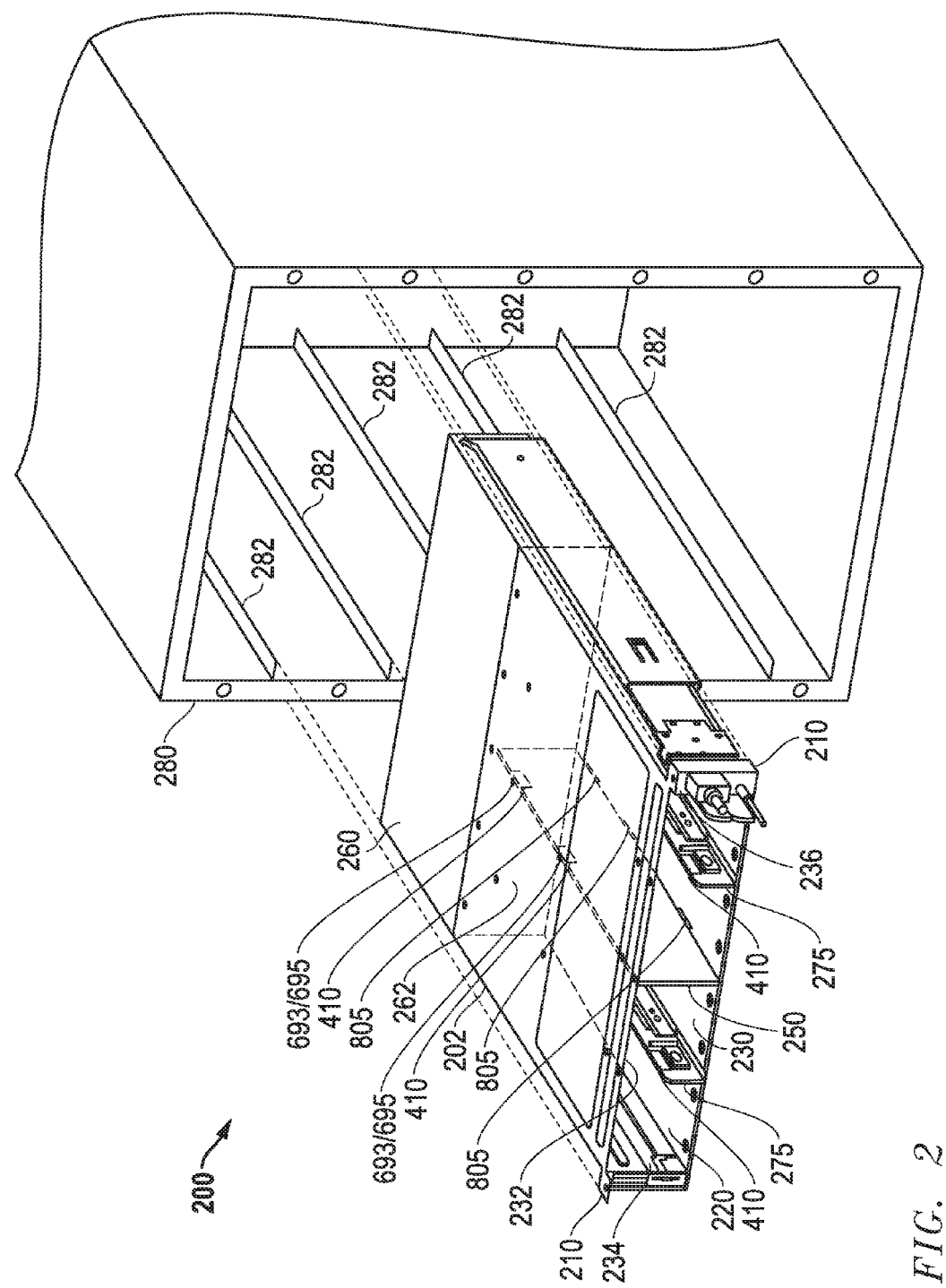
FIG. 2 illustrates an exploded front perspective view of a rack mount chassis system according to one exemplary embodiment of the disclosed apparatus and methods.

FIG. 2 illustrates an exploded front perspective view of one embodiment of a rack mount chassis system 200 including a multi-chassis cabinet 280 that is configured to slidably receive one or more chassis enclosures 202 (e.g., such as 1 U, 2 U, 3 U, 4 U, etc. rack mount chassis enclosures) upon internal cabinet side supports 282 as shown. As shown in FIG. 2, a 2 U chassis enclosure cavity 220 is provided within a front portion of chassis enclosure 202 with a contiguous front cavity opening that is defined between two rack mount ears 210 that are configured to be secured to opposing side members of a cabinet 280 so as to mount chassis enclosure 202 with other similar chassis enclosures in the cabinet 280. In FIG. 2, cavity 220 of chassis enclosure 202 is shown empty of information handing system components, it being understood that rack mount server components may be enclosed and operably coupled therein, such as processor/s, controller/s, memory modules, power supply unit/s, cooling fan/s, storage (e.g., hard drive, solid state drive, optical drive, etc.), connectors, input/output (I/O) components, etc. Also shown in FIG. 2 is an optional back compartment 260. Further information on rack mount chassis and information handling system components may be found, for example, in U.S. Pat. No. 9,280,191 and in U.S. patent application Ser. No. 15/096,333 filed Apr. 12, 2016, each of which is incorporated herein by reference in its entirety.

Still referring to the embodiment of FIG. 2, cavity 220 is defined within chassis enclosure 202 between first side (e.g., top side) 232, internal back side 262, second side (e.g., bottom side) 230 and opposing third and fourth sides 234 and 236 (e.g., opposing lateral sides) of chassis enclosure 202. A 2 U height vertical divider wall 250 is shown installed within cavity 220 between first and second sides 232 and 230 of enclosure 202. Also present are 1 U height divider walls 275 that extend inwards and upwards from second side 230 of enclosure 202, and which may be mechanically coupled to a 1 U height horizontal shelf (not shown in FIG. 2). Each of chassis sides 232, 230, 234, 236 and 262, as well as divider walls 250 and 275, side supports 282, and any horizontal shelves that are present may be constructed of any suitable material/s (e.g., such as sheet metal panels, steel panels, fiberglass or plastic panels, etc.) for containing and/or supporting information handling system components. Also shown in FIG. 2 are floating extensions 410 that secure the first side of divider wall to the inside surface of chassis enclosure first side 232 in a manner that is described further herein. Each 1 U height divider wall 275 may also include floating extensions provided to secure the first end (e.g., top end) of divider wall 275 to a 1 U height shelf. Divider walls 275 may be present to separate chassis enclosure cavity 220 into separate bays or compartments for receiving and containing different information handling system components, such as storage devices (e.g., storage sleds and/or individual hard disk drives, optical drives, solid state drives, etc.), processing modules (e.g., compute sleds including host, service and/or processors, memory, etc.), AC/DC and/or DC/DC power supply units or power supply sleds, etc.

Figure 3:
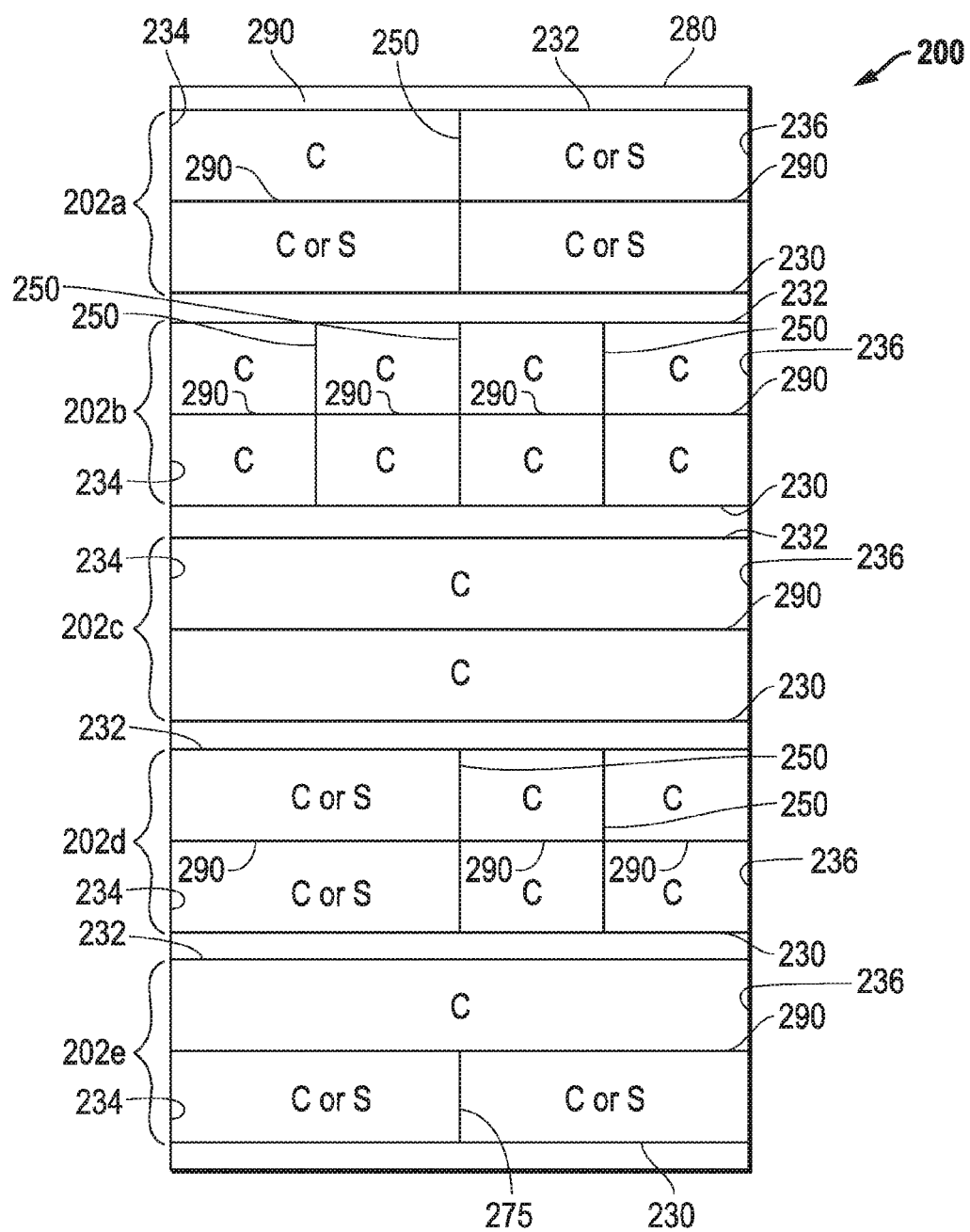
FIG. 3 illustrates a front view of multi-chassis cabinet according to one exemplary embodiment of the disclosed apparatus and methods.

FIG. 3 illustrates a front view of some possible examples of different information handling system chassis configurations that may be realized according to one exemplary embodiment of a multi-chassis cabinet 280 having multiple 2 U height chassis enclosures 202a to 202e installed therein. As shown in the embodiment of FIG. 3, individual chassis compartments for computer sleds (labelled "C") and storage sleds (labelled "S") may be selectably provided by selection and installation of an appropriate combination of switchable full height (2 U) divider walls 250, half-height (1 U) divider walls 275, and/or horizontal shelves 290 (that may each vary in length to fit the width of a given C or S compartment). 1 U divider walls 275 may be mechanically coupled, for example, between a fixed full width horizontal shelf 290 and second (or bottom) side 230 of a 2 U or larger chassis enclosure as shown, or may be mechanically coupled directly between a first (or top) side and second (or bottom) side of a 1 U chassis enclosure.

Still referring to FIG. 3, it will be understood that a chassis enclosure 202 may be initially configured with any one of such different chassis compartment configurations, or may be reconfigured from a first chassis configuration to a second and different chassis configuration after manufacture, e.g., such as in the field. Although floating extensions 410 and fixed connectors in the form of fixed extensions 420 of FIGS. 4-11 are described herein in relation to full height (2 U) vertical divider walls, it will be understood that floating and fixed extensions may be employed on ends of divider wall to secure any height divider wall between any two horizontal surfaces (e.g., top chassis side, bottom chassis side, or horizontal shelf or shelves) within a chassis enclosure cavity. Moreover, switchable divider walls 250 and/or 275 may be suitably dimensioned for use with any height chassis enclosure, e.g., including 3 U, 4 U, etc. chassis enclosures. Further, it will be understood that a fixed connector may be provided on a second end (e.g., bottom end) 413 of a divider wall 250 in the form of a fixed recess that is configured to receive an aligned post or other fixed extension feature that extends inward (e.g., upward) into the chassis enclosure cavity from the second side 230 into a chassis enclosure cavity 220.

Figure 4:
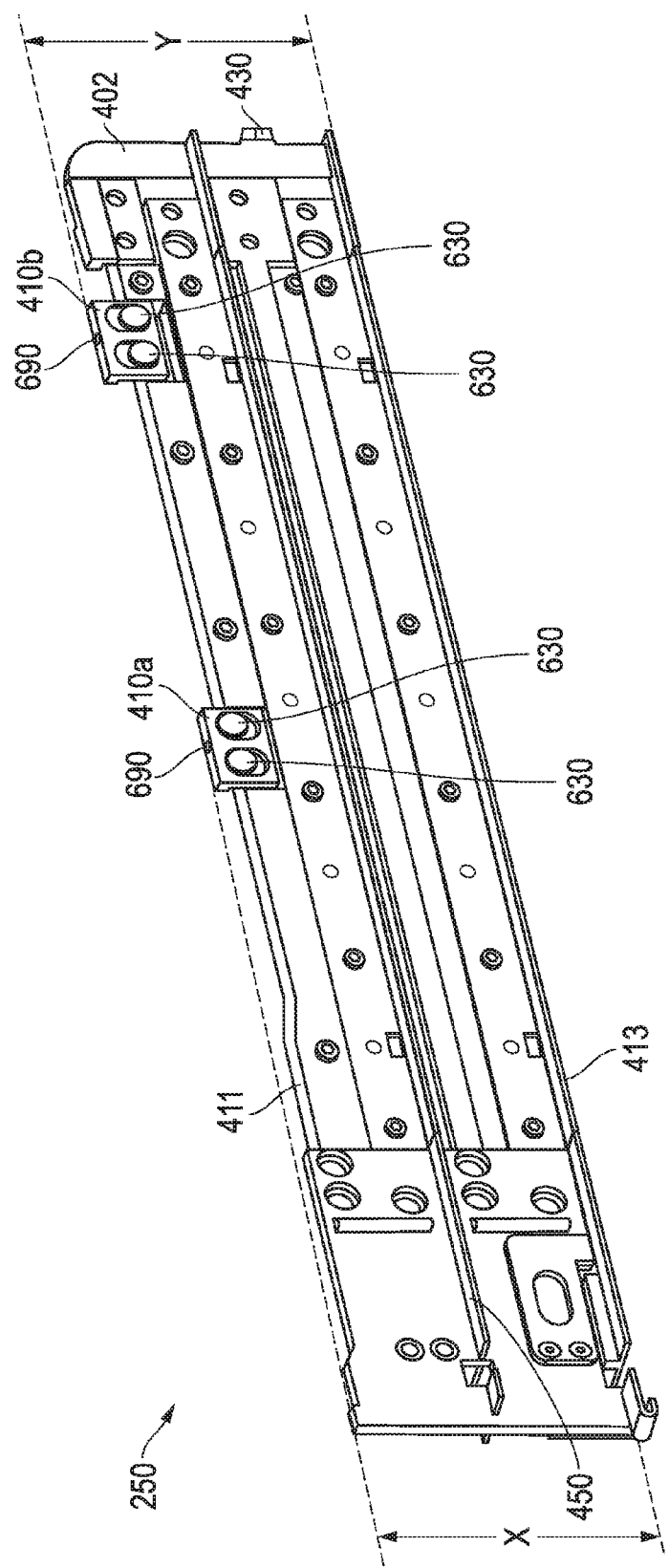
FIG. 4 illustrates a side perspective view of divider wall according to one exemplary embodiment of the disclosed apparatus and methods.

FIG. 4 illustrates a side perspective view of a full height 2 U divider wall 250 as it may be configured with extendable floating extensions 410 mounted on a first end 411 of divider wall 250. As shown in FIG. 4, divider wall 250 has a height "X" between first end 411 and second end 413 that is less than the internal distance between the second side 230 and first side 232 of a 2 U chassis enclosure 202, while each of extensions 410 are configured to be outwardly extendable away from the first end 411 of divider wall 250 to a distance "Y" from the second end of divider wall 413. To illustrate, the forward floating extension 410a is shown in retracted position toward the first end 411 of divider wall 250 to a position substantially even with the uppermost surface of the front end of first end 411 of divider wall 250, while the rear floating extension 410b is shown moved outward and in this case upward in an extended position further away from first end 411 of divider wall 250. It will be understood that the exemplary embodiment of FIG. 4 is exemplary only, and that it is possible in other embodiments that each floating extension may be retracted to a position that is closer to (but above) the first end of 411 of divider wall 250 when in a retracted position, and/or may be retracted to a position that is recessed below the first end of 411. Moreover other first end profiles of a divider wall 250 may be employed, including a substantially flat first end that is of equal height all the way across the first end of divider wall 250.

As will be described further herein, each of floating extensions is provided in this embodiment with a fastener opening 690 (e.g., threaded opening) for securing the first end 411 of divider wall 250 to first side 232 of chassis enclosure 250. Also shown in FIG. 4 is an optional rear fixed extension feature 430 that may be inserted during divider wall installation into a corresponding slot defined in internal back side 262 (e.g., in this exemplary embodiment a front sidewall of optional back compartment 260) of chassis enclosure 202 to anchor divider wall 250 to the back side 262 for further stability.

Figure 10C:
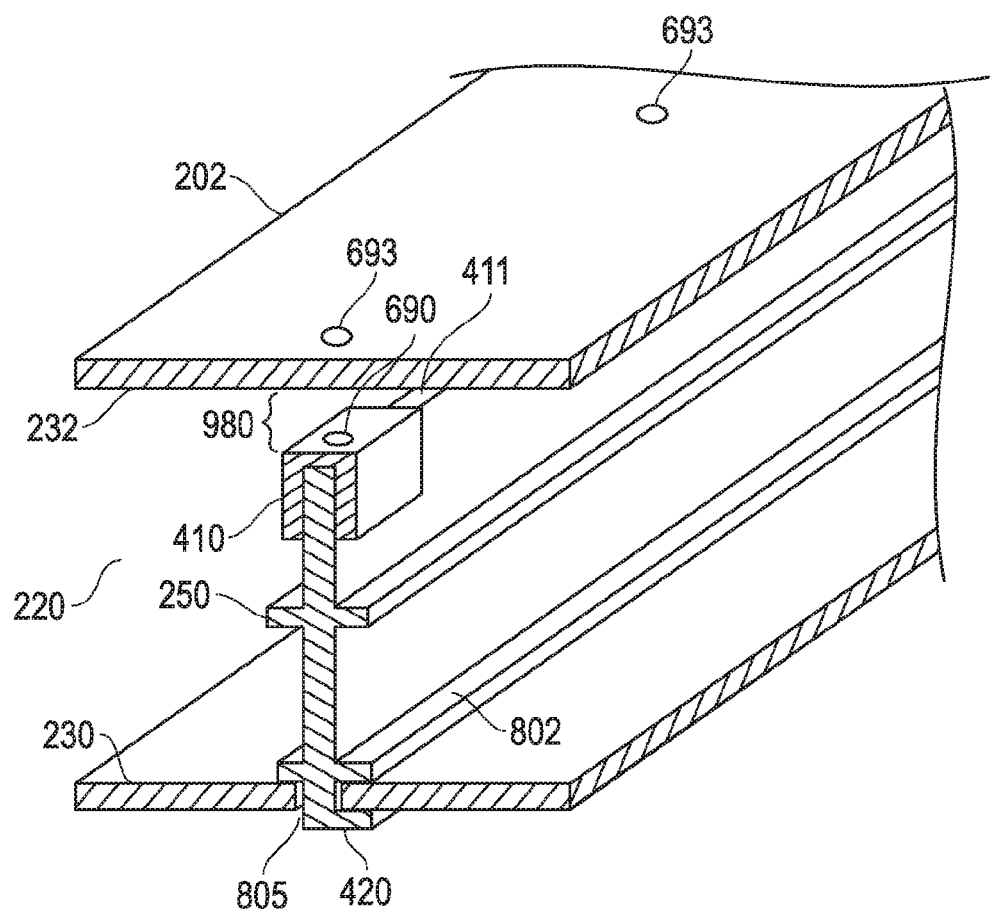
FIG. 10C illustrates a partial front perspective view of a divider wall and chassis enclosure cavity according to one exemplary embodiment of the disclosed apparatus and methods.
Figure 11A:
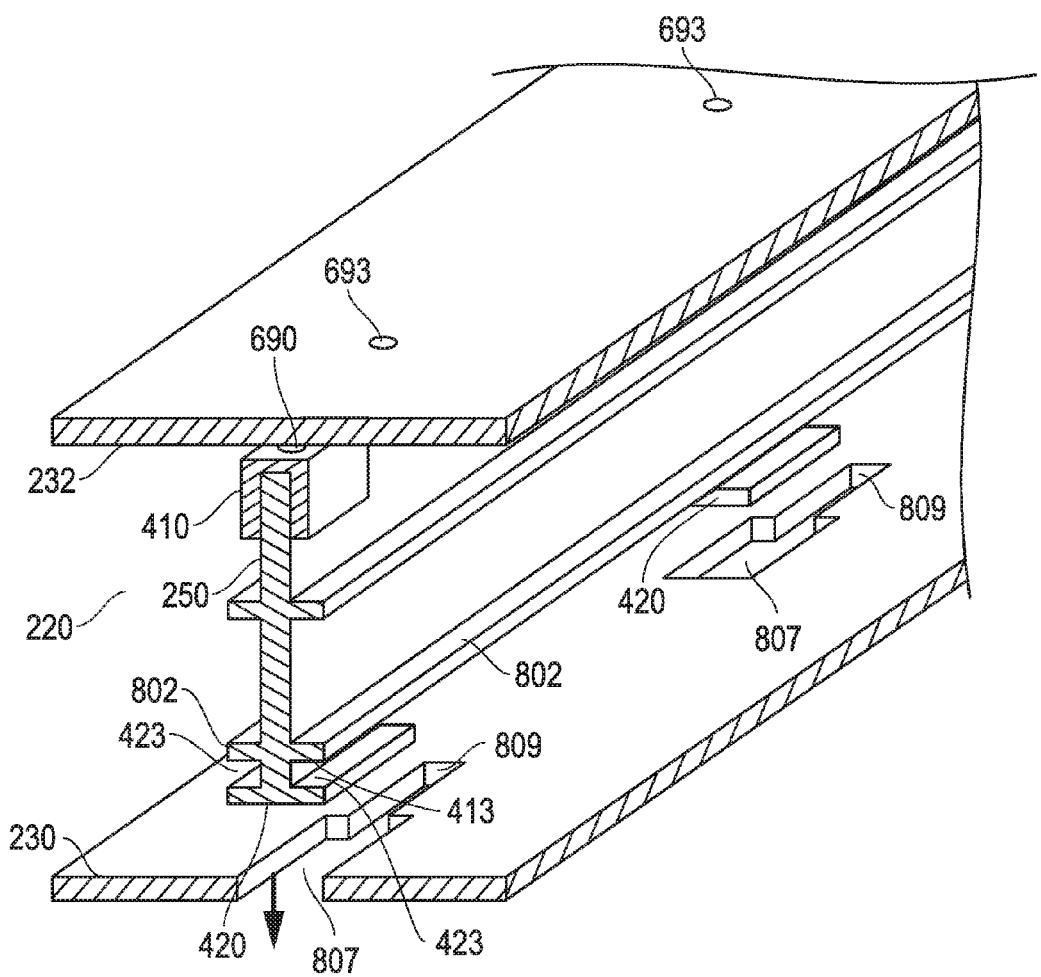
FIG. 11A illustrates a partial front perspective view of a divider wall and chassis enclosure cavity according to one exemplary embodiment of the disclosed apparatus and methods.
Figure 11B:
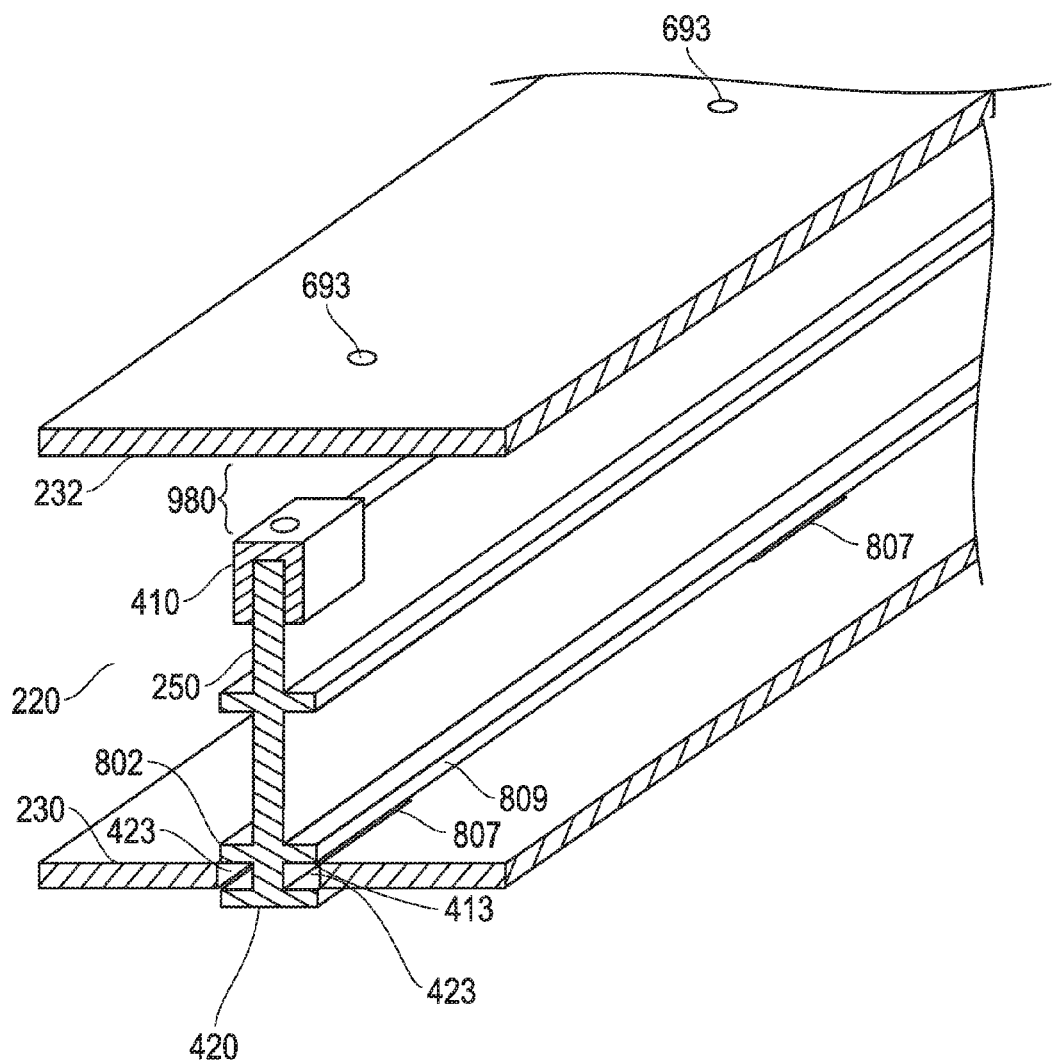
FIG. 11B illustrates a partial front perspective view of a divider wall and chassis enclosure cavity according to one exemplary embodiment of the disclosed apparatus and methods.

Still referring to the embodiment of FIG. 4, an extended distance "Y" of floating extensions 410 may be substantially equal to the internal cavity height distance between the second side 230 and first side 232 of a chassis enclosure 202, while maximum divider wall height "X" may be any distance that is less than Y and that is suitable for creating an open divider gap between uppermost portions of divider wall 250 and the second side 230 and/or first side 232 of a chassis enclosure 202 when divider wall 250 is installed within enclosure cavity 220 in perpendicular relationship to the plane of second side 230 and first side 232 the enclosure 202 (e.g., in vertical position as shown in FIGS. 10C and 11B). As a non-limiting example, in one embodiment for a 2 U chassis enclosure (e.g., having an internal cavity height distance of 82 millimeters between its second side 230 and first side 232), a maximum divider wall body height "X" measured from uppermost surface of divider wall first end 411 to lowermost surface of divider wall second end 413 (and not including any insertable extensions from dividers wall second end such as extension plates 420 of FIG. 8) may be from about 75 millimeters to about 81 millimeters (alternatively from about 80 millimeters to about 81 millimeters). In such an exemplary embodiment, these example dimensions may yield a total maximum gap space of from about 7 millimeters to about 1 millimeter, alternatively about from 2 millimeters to about 1 millimeter, between either of divider wall first end 411 or second end 413 and a corresponding adjacent chassis enclosure first side 232 or second side 230, respectively, when the opposing end 413 or 411 is contacting the adjacent chassis enclosure second side 230 or first side 230, respectively. It will be understood that these dimensions are exemplary only and that any greater or lesser value of "X", "Y", and/or maximum open divider gap space may be provided that is suitable for allowing insertion and installation of a divider wall 250 within an enclosure cavity 220 in a manner as described elsewhere herein.

In the same 2 U chassis enclosure embodiment, an extended distance "Y" of floating extensions 410 above the lowermost surface of divider wall second end 413 may be at least about 82 millimeters above the lowermost surface of divider wall second end 413. In such an embodiment, a floating extension 410 may be configured to have a retracted position in which the top of floating extension 410 is about 75 millimeters (alternatively about 79 millimeters, further alternatively about 81 millimeters, further alternatively from about 75 millimeters to about 81 millimeters) above the lowermost surface of divider wall second end 413. In such an exemplary embodiment, these example dimensions may yield a total maximum extension gap space (e.g., see open extension gap 980 of FIGS. 10C and 11B) of from about 7 millimeters to about 1 millimeter between a first (e.g., top) end surface of a retracted floating extension 410 and chassis enclosure first side 232 when divider wall 250 is installed within enclosure cavity 220 in perpendicular relationship to the plane of second side 230 and first side 232 the enclosure 202 (e.g., in vertical position as shown in FIGS. 10C and 11B). Once again, these dimensions are exemplary only, and it will be understood that any other greater or lesser maximum vertical extension gap space may be provided that is suitable for allowing insertion and installation of a divider wall 250 within an enclosure cavity 220 in a manner as described elsewhere herein.

FIG. 5 is a partial front perspective view of a divider wall 250 installed within chassis enclosure 220, once again for shown for purposes of illustration with floating extension 410a shown in retracted position and floating extension 410b in extended position against the underside of first side 232 of chassis enclosure 202 where it is secured to first side 232 using fastener 695 as will be described further herein. It will be understood that floating extension 410a may be similarly extended and secured to first side 232 after divider wall 250 is positioned within chassis enclosure cavity 220 in perpendicular relationship to first side 232 of chassis enclosure 202.

Figure 6A:
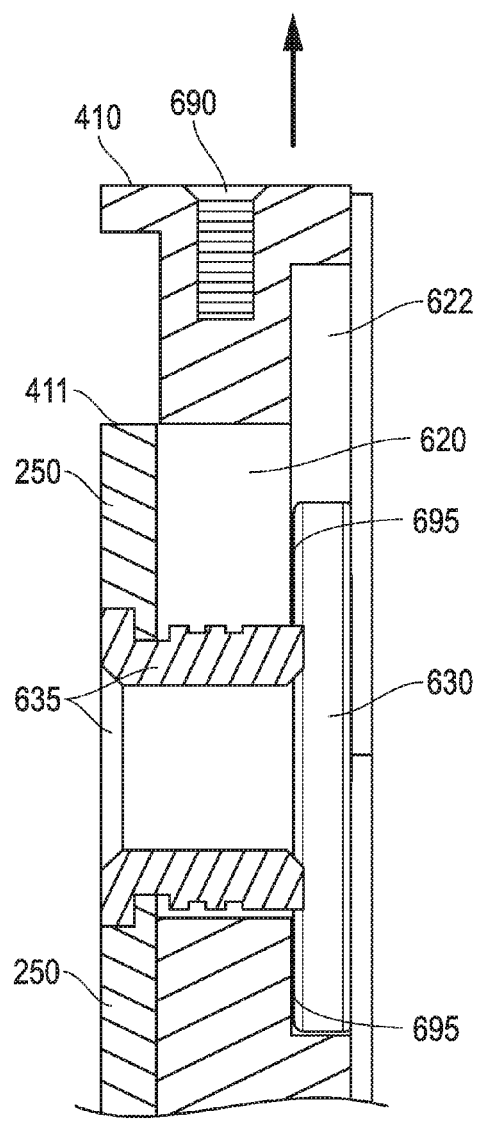
FIG. 6A illustrates a cross-sectional view of a floating extension according to one exemplary embodiment of the disclosed apparatus and methods.
Figure 6B:
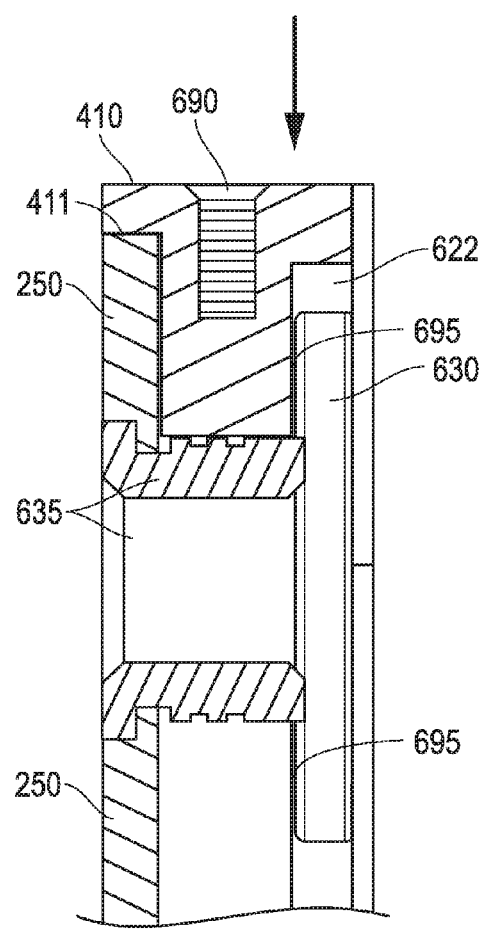
FIG. 6B illustrates a cross-sectional view of a floating extension according to one exemplary embodiment of the disclosed apparatus and methods.

FIG. 6A is a cross-sectional view of one embodiment of floating extension 410 shown in extended position in the manner of floating extension 410b of FIGS. 4 and 5. As shown, floating extension 410 of FIG. 6 includes an inner elongated slide opening 620 received around a center post 635 that is secured to divider wall 250, and an outer elongated slide slot 622 received around a retention or standoff head 630 that is mechanically coupled to (or integrally formed on) center standoff post 635 and configured to retain floating extension 410 in freely sliding relationship to divider wall 250 while at the same time constraining movement of floating extension 410 in the x-axis or horizontal direction as shown. Inner slide opening 620 and outer slide slot 622 are configured to restrain movement of floating extension 410 to a defined range of movement in the y-axis or vertical direction. In this embodiment sufficient space 695 exists between each standoff head 630 and inner surface of outer slide slot 622 such that each floating extension 410 is free to fall or slide (e.g., downward due to gravity) toward first end 411 of divider wall 250 around center standoff post 635 into retracted position of FIG. 6B, and may be extended into position 6A by manipulation by a human hand or by action of threaded fasteners as described below. In one exemplary embodiment, length of inner slide opening 620 may be selected to provide floating extension 410 a travel distance between its extended and retracted positions of from about 2 millimeters to about 4 millimeters, and alternatively about 3 millimeters. However, travel distance of floating extension 410 may be alternatively configured in other embodiments to be less than about 2 millimeters or greater than about 4 millimeters.

Figure 7A:
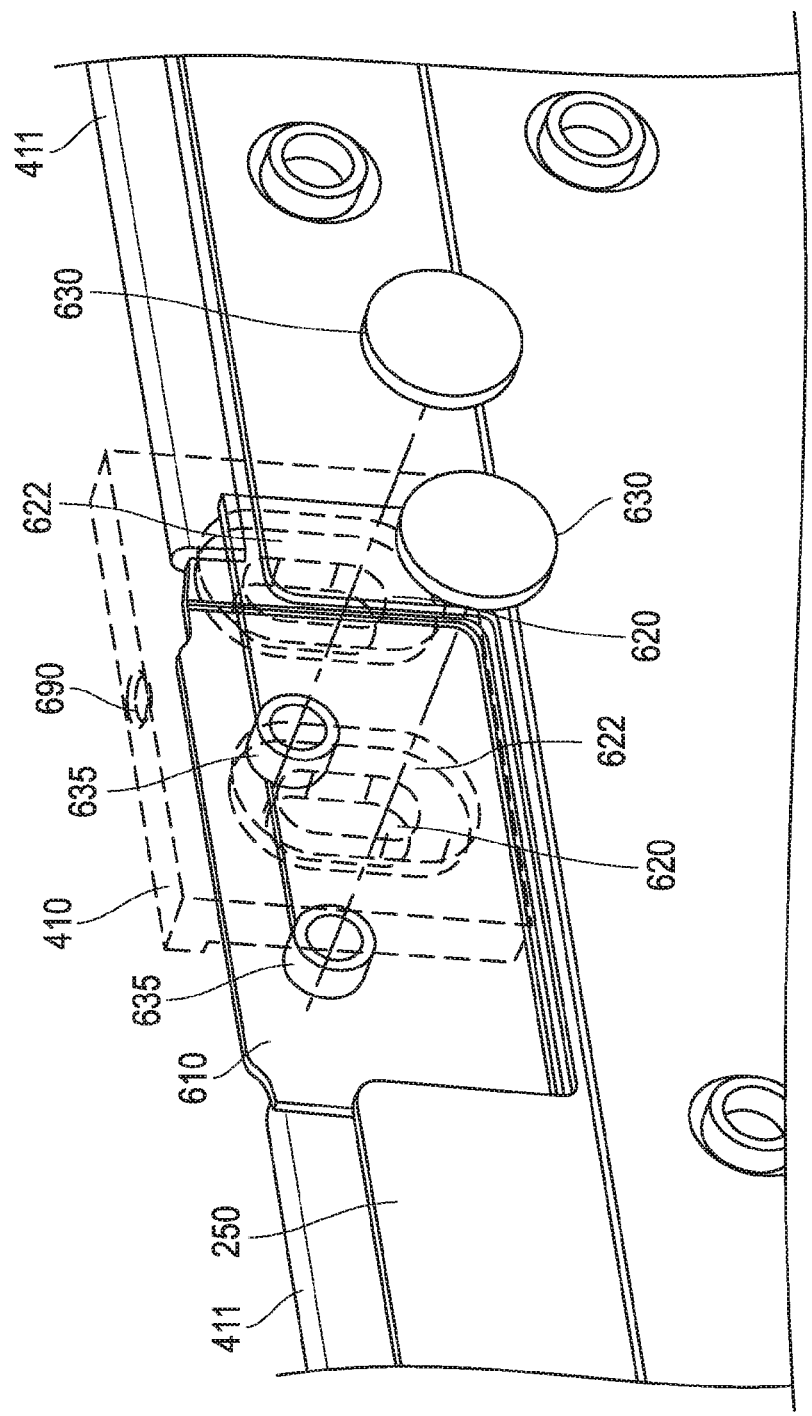
FIG. 7A illustrates a partial exploded side perspective view of a floating extension and divider wall according to one exemplary embodiment of the disclosed apparatus and methods.
Figure 7B:
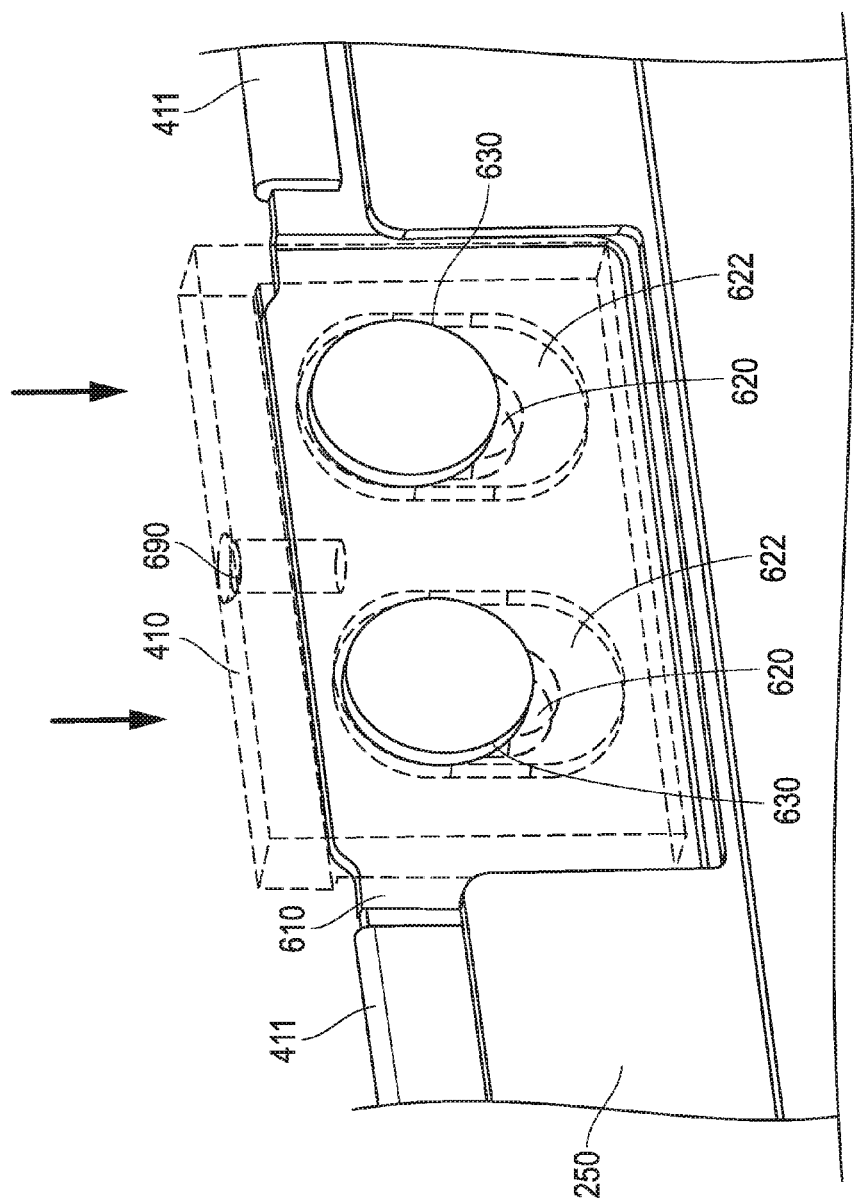
FIG. 7B illustrates a side perspective view of a floating extension and divider wall according to one exemplary embodiment of the disclosed apparatus and methods.
Figure 7C:
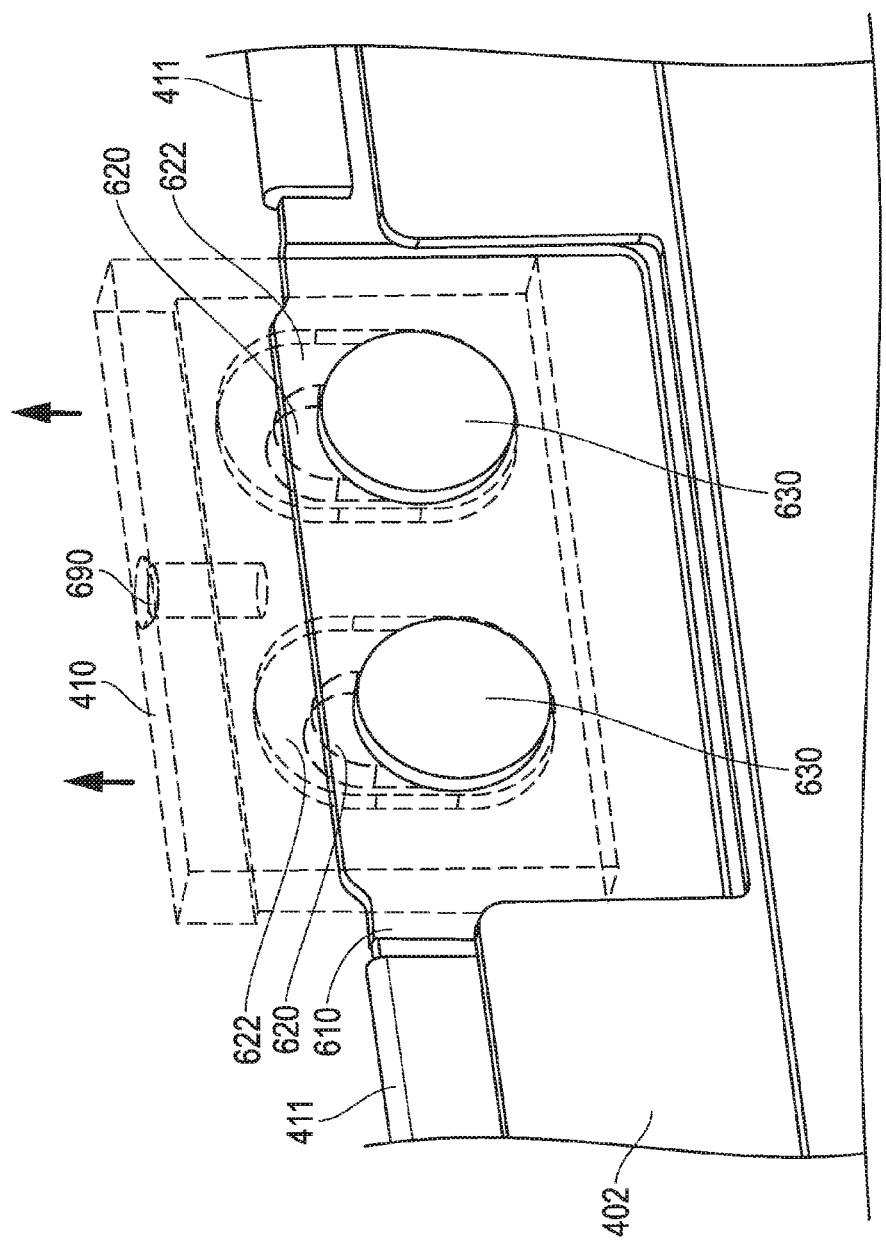
FIG. 7C illustrates a side perspective view of a floating extension and divider wall according to one exemplary embodiment of the disclosed apparatus and methods.

FIG. 7A illustrates a partial exploded side perspective view of one embodiment of floating extension 410 and divider wall 250, with floating extension 410 shown in dashed outline. In this embodiment, floating extension 410 is configured to extend upward to the side of divider wall 250, although any other suitable configuration may be employed such as illustrated in FIGS. 10A-10E and 11A-11D. FIGS. 7B and 7C illustrate side perspective views of one embodiment of floating extension 410 operably secured to divider wall 250, with FIG. 7B showing floating extension 410 in retracted position toward first end 411 of divider wall 250 in the direction of the arrows and FIG. 7C showing floating extension 410 in extended position outward and away from first end 411 of divider wall 250 in direction of the arrows. In one embodiment, a floating extension 410 may be moved between extended and retracted positions by a human hand and fingers after divider wall is positioned within chassis enclosure cavity 220, and then secured with a threaded fastener 695 that is engaged and received within threaded fastener hole 690 in a manner such as described and illustrated further herein in relation to FIG. 11C. In another exemplary embodiment, a threaded fastener 695 may be received in threaded fastener hole 695 and used to pull extension 410 upward into extended position by virtue of screw-in rotation of the engaged fastener external threads into the internal threads of the fastener hole 690 in the manner illustrated in FIG. 11C.

Figure 8:
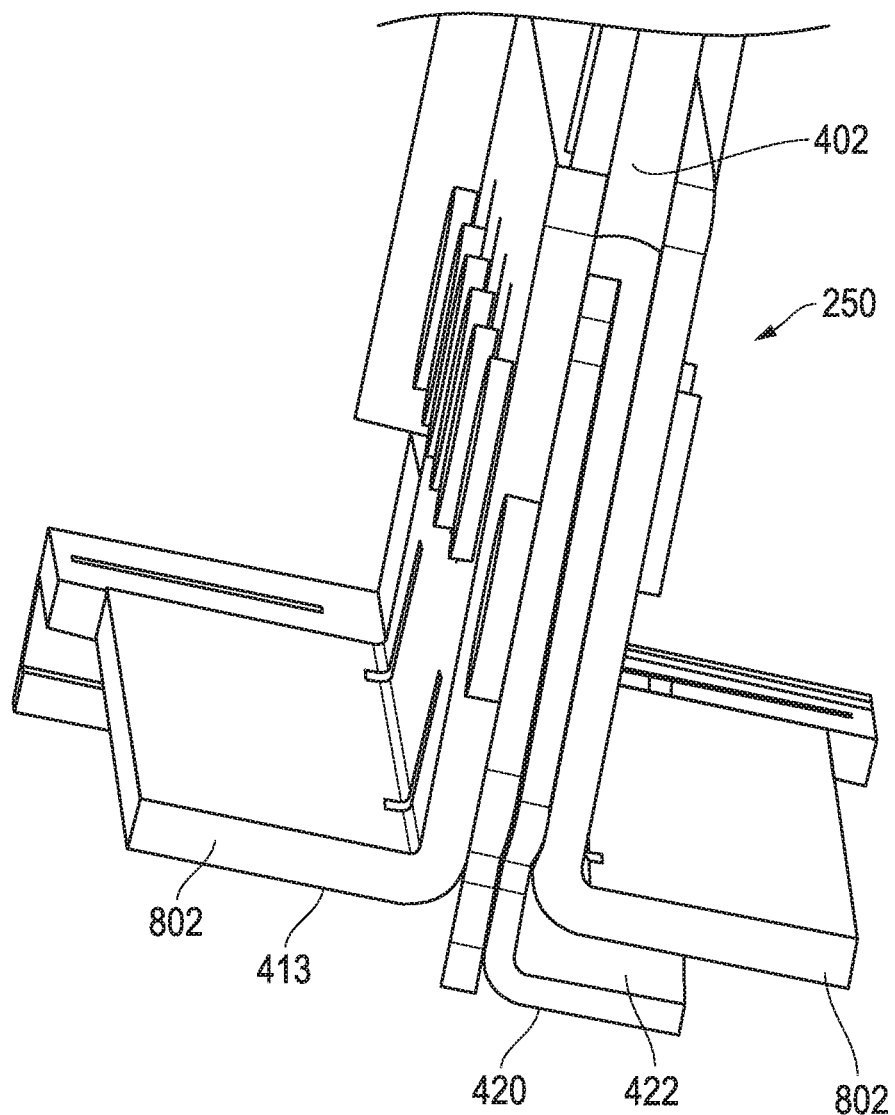
FIG. 8 illustrates a partial front perspective view of a divider wall according to one exemplary embodiment of the disclosed apparatus and methods.

FIG. 8 illustrates a partial front perspective view of one embodiment of a divider wall 250 having a second end 413 that is created by horizontal flanges 802 that are coupled to extend perpendicularly from a central member 402. As further shown, a hook or L-shaped fixed extension plate 420 protrudes outwardly (e.g., downwardly) from central member 402 beneath second end 413 to create a single-sided insertion gap 422 between a horizontal upper surface of fixed extension 420 and a lower surface of one of horizontal L-shaped flanges 802. It will be understood that the embodiment of FIG. 8 is exemplary only, and that one or more divider wall features such as flanges 802 and/or fixed extension 420 may be integrally formed together with a central member 402 or otherwise constructed in any suitable manner.

FIG. 9A illustrates a side perspective view of the full divider wall component 250 of FIG. 8 with underside of divider wall component 250 positioned upward. In this embodiment, divider wall 250 includes three spaced hooks or L-shaped fixed extensions 420 that extend outwardly from the second end 413 of divider wall 250. FIG. 9B illustrates an enlarged view of a portion of divider wall 250 of FIG. 9A showing an underside close up view of one of fixed extensions 250. FIGS. 10A to 10D shows cut-away sectional views that illustrate sequential steps of one embodiment that may be implemented for insertion and installation of a divider wall 250 similar to that shown in FIGS. 8 and 9A-9B between first side 232 and second side 230 of chassis enclosure 202. As shown, in this embodiment floating extension 410 is configured as a crown that straddles or captures divider wall 250 in a position that slides outward (e.g., upward) away from first end 411 of divider wall 250 and inward (e.g., downward) toward first end 411 of divider wall 250, e.g., by a standoff head 630 that is mechanically coupled to (or integrally formed on) a center standoff post 635 such as in the manner shown in FIGS. 6A-6B or by using any other suitable configuration such as a bar, rod or pin that is attached to the underside of the crown of floating extension 410 and that extends into the first end of divider wall 250 to allow constrained moment of floating extension 410 between the extended and retracted positions in the manner illustrated, or such as bar, rod or pin that is attached to an inner side of floating extensions 410 and that is received within an elongated vertical slot defined adjacent the first end of divider wall 250 and being of sufficient length and orientation to allow constrained moment of floating extension 410 between the extended and retracted positions in the manner illustrated.

As shown in FIG. 10A, divider wall 250 is first inserted within enclosure cavity 220 with one side of divider wall oriented at an acute angle α relative to the second side 230 of chassis enclosure 202 and the opposing side of divider wall oriented at an acute angle relative to the first side 232 of chassis enclosure 202. At this time divider wall 250 is aligned in center front-to-back relationship within chassis enclosure cavity 220 (e.g., see FIG. 2), such that each fixed extension 420 is aligned for insertion into a corresponding extension opening 805 in second side 230 of chassis enclosure 202 that is dimensioned to receive the respective fixed extension 420 as shown in FIG. 10A. In one embodiment, divider wall 250 is first inserted within enclosure cavity 220 with one side of divider wall oriented at an acute angle relative to the second side 230 of chassis enclosure 202 and the opposing side of divider wall oriented at an acute angle relative to the first side 232 of chassis enclosure 202, with the acute angle of insertion being, for example, from about 5° to about 85°, alternatively from about 10° to about 80°, further alternatively about 20° to about 70°, further alternatively about 30° to about 60°, further alternatively about 40° to about 50°, further alternatively about 45° to about 80°, further alternatively from about 55° to about 80°, and further alternatively from about 65° to about 80°. However, such an acute angle may be any greater, lesser or different range of acute angles in other embodiments.

Figure 10D:
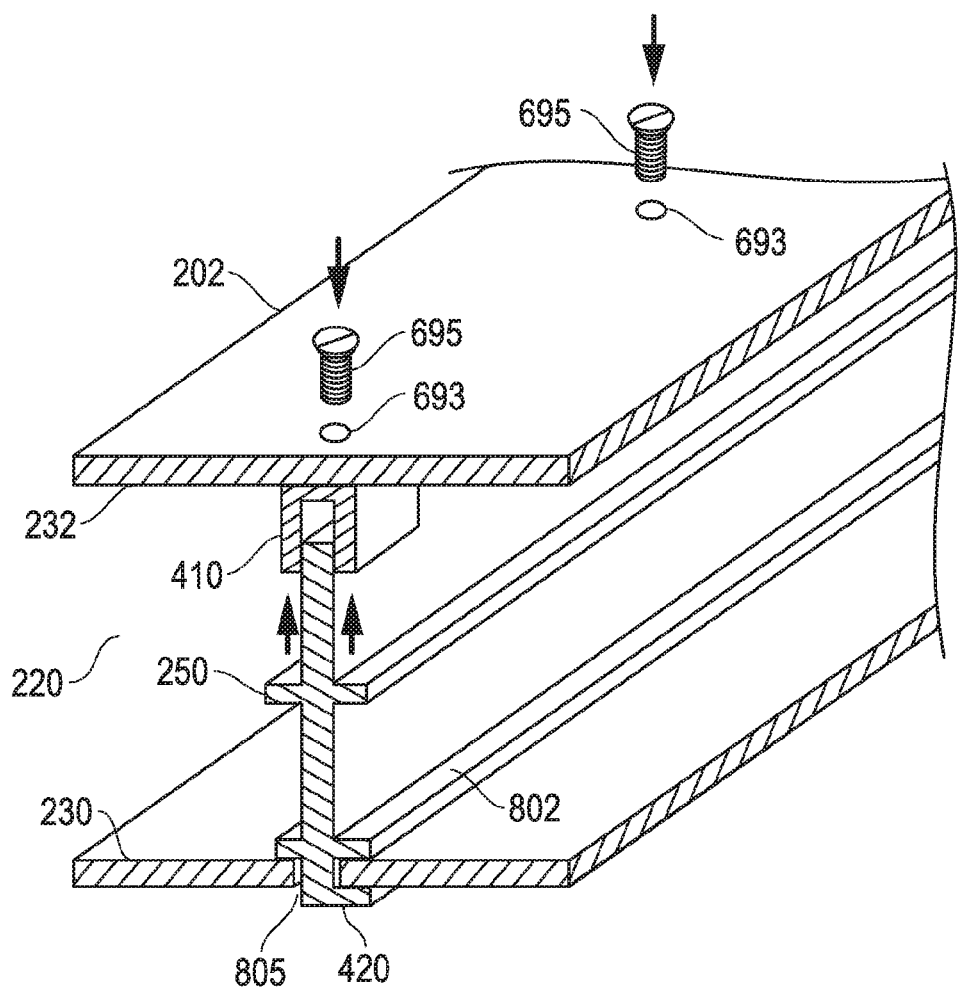
FIG. 10D illustrates a partial front perspective view of a divider wall and chassis enclosure cavity according to one exemplary embodiment of the disclosed apparatus and methods.
Figure 10E:
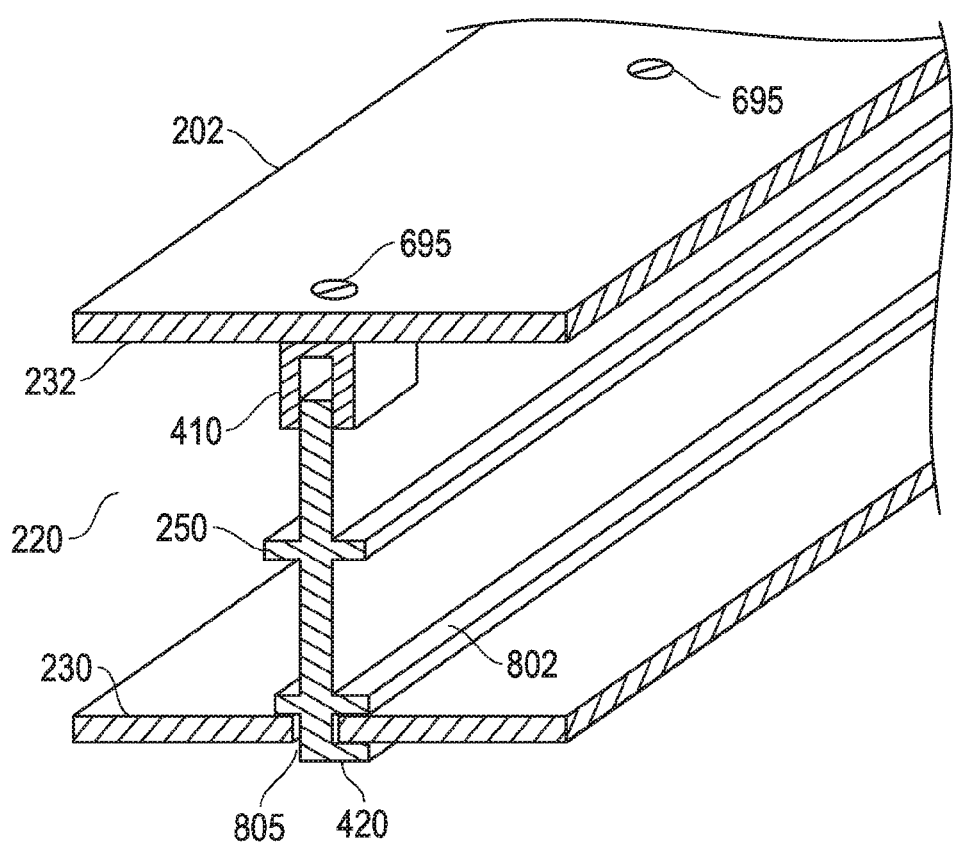
FIG. 10E illustrates a partial front perspective view of a divider wall and chassis enclosure cavity according to one exemplary embodiment of the disclosed apparatus and methods.

As shown in FIG. 10B, each fixed extension is then inserted into a corresponding extension opening 805 and the first end 411 of divider wall 250 is rotated upward in the direction of the arrow to bring each of floating extensions 410 into alignment with a corresponding fastener hole 693 that is defined in the first side of chassis enclosure 202 as shown in FIGS. 10B and 10C. At the same time each hook or L-shaped fixed extension 420 is inserted through a corresponding extension opening 805, and divider wall 250 rotated which in turn causes the fixed extension 420 to be rotated into a trapped position within the extension opening 805 where it is anchored to substantially prevent upward or side-to-side displacement of the second end 413 of divider wall 250 relative to second side 230 of chassis enclosure 202 as shown in FIG. 10C. As shown in FIG. 10C, an open extension gap 980 exists at this time between first end (e.g., top end) of each floating extension 410 and the underside of first side 232 of chassis enclosure 202, as does an open gap exist between first end of divider wall 250 and underside of first side 232 of chassis enclosure 202. Presence of open extension gap 980 and an open space or gap between first end of divider wall 250 and underside of first side 232 allows clearance for divider wall 250 to be rotated without bowing or compression between first chassis side 232 and second chassis side 230 as shown in sequential steps of FIGS. 10A-10C. As shown in FIG. 10D, threaded fasteners 695 are then inserted through openings 693 defined in first side 232 of chassis enclosure 202 and threaded into respective floating extensions 410, which may be raised in the direction of the arrows to absorb and eliminate the extension gap 980 by human hand or by threading action of respective fasteners 695 as shown. FIG. 10E shows divider wall 250 secured by threaded fasteners 695 in fixed relationship between floating extensions 410 and anchored fixed extensions 420, with no gap existing between floating extensions 410 and first enclosure side 232 which contact and abut each other when threaded fasteners 695 are tightened.

FIGS. 11A-11D show cut-away sectional views that illustrate sequential steps of another embodiment that may be implemented for insertion and installation of a divider wall 250 between first side 232 and second side 230 of a chassis enclosure cavity 220. In this embodiment, fixed extensions 420 are configured as "T-shaped" extensions that form opposing insertion gaps 423 with flanges 802 on opposite sides of a surface of second end 412 of divider wall 250. As shown in FIG. 11A, divider wall 250 is first inserted into chassis enclosure 202 and divider wall 250 is aligned in center front-to-back relationship within chassis enclosure cavity 220 (e.g., see FIG. 2), such that each fixed extension 420 of this embodiment is aligned for insertion into a corresponding slotted extension opening 807 in second side 230 of chassis enclosure 202 that is dimensioned to receive the respective fixed extension 420 as shown in FIG. 11B. As shown in FIG. 11A, an open extension space or gap between floating extension 410 and underside of first side 232, as well as open divider space or gap between first end of divider wall 250 and underside of first side 232, allows clearance for divider wall 250 to be inserted into cavity 220 to align fixed extensions 420 for insertion into extension openings 807 without bowing or compression between first chassis side 232 and second chassis side 230 as shown in sequential steps of FIGS. 10A-10C.

As shown in FIG. 11B, divider wall 250 is then lowered toward second side 230 so that each fixed extension 420 is inserted into a corresponding extension opening 807 with the plane of divider wall 250 oriented in substantially perpendicular orientation to first side 232 and second side 230 of chassis enclosure 202. As shown in FIG. 11B, an open extension gap 980 exists at this time between a first end (e.g., top end) of each floating extension 410 and the underside of first side 232 of chassis enclosure 202, as does an open divider gap exist between first end of divider wall 250 and underside of first side 232 of chassis enclosure 202. These open gaps provide clearance to allow divider wall 250 to be free from mechanical interference with first side 232 of chassis enclosure 232 to allow divider wall 250 to slide relative to first side 232 of chassis enclosure 202.

Figure 11C:
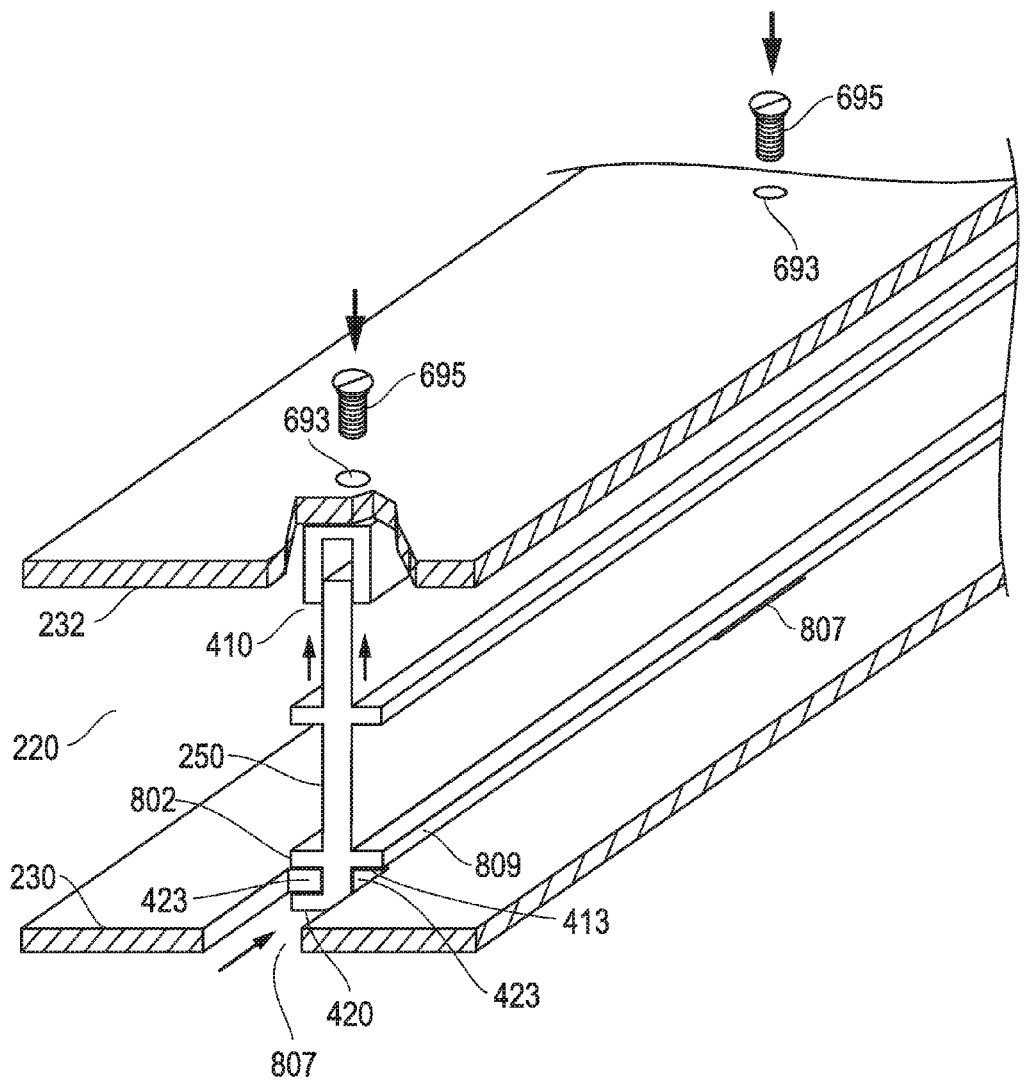
FIG. 11C illustrates a partial front perspective view of a divider wall and chassis enclosure cavity according to one exemplary embodiment of the disclosed apparatus and methods.
Figure 11D:
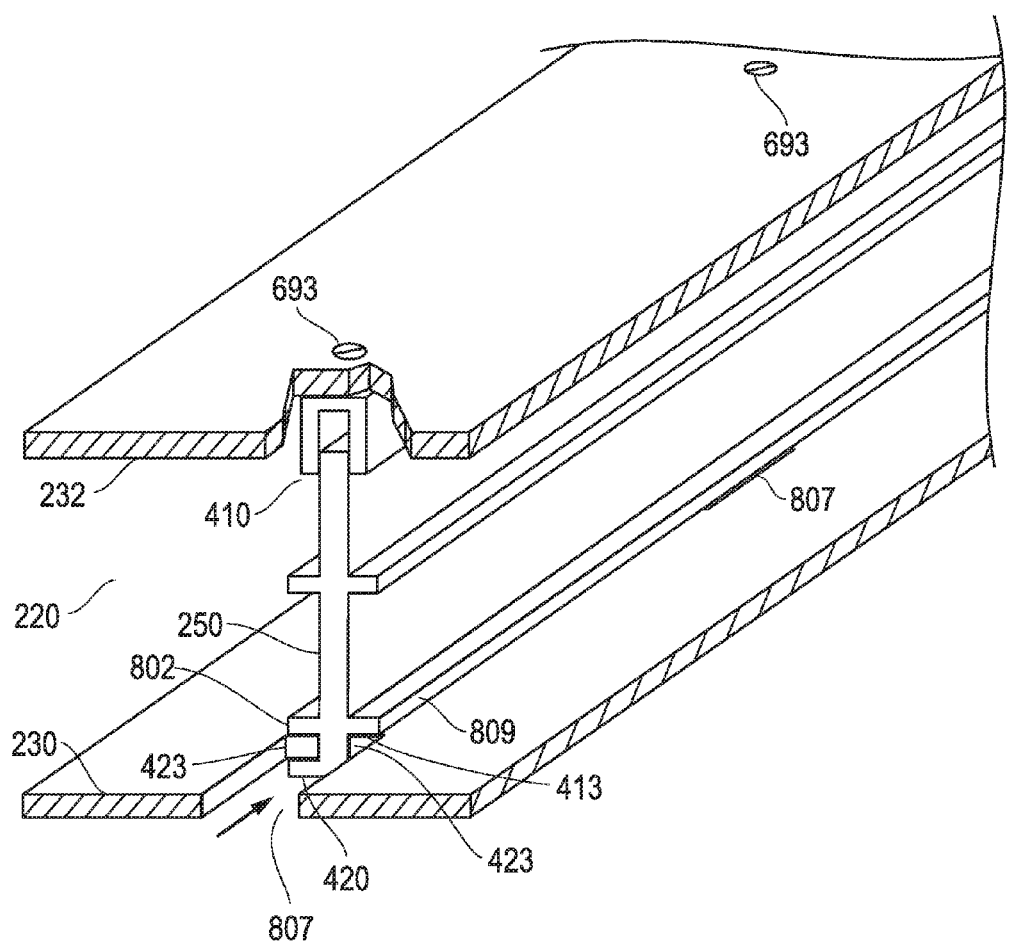
FIG. 11D illustrates a partial front perspective view of a divider wall and chassis enclosure cavity according to one exemplary embodiment of the disclosed apparatus and methods.

Next, divider wall 250 is slid backward inside cavity 220 to cause each of fixed extensions 420 to also slide backward within a corresponding extension opening 807 until second side panel 230 is received within insertion gaps 423 between fixed extensions 420 and flanges 802 inside narrowed extension slot opening 809 (e.g., about one-half the width of extension opening 807 and complementary dimensioned to receive the width of divider wall 250 as it exists between flanges 802 and the terminal end width of H-shaped fixed extension 420) as shown. At the same time each of fixed extensions 410 are aligned with a corresponding fastener hole 693 that is defined in the first side of chassis enclosure 202 as shown in FIG. 11C. In the position of FIG. 11C, fixed extensions 410 are now anchored to substantially prevent upward or side-to-side displacement of the second end 413 of divider wall 250 relative to second side 230 of chassis enclosure 202. As shown in FIG. 11C, threaded fasteners 695 are then inserted through openings 693 defined in first side 232 of chassis enclosure 202 and threaded into respective floating extensions 410, which may be raised in the direction of the arrows by human hand or by threading action of respective fasteners 695 to absorb and eliminate the gap 980 as shown in cut-away section of FIG. 11C. FIG. 11D shows divider wall 250 secured by threaded fasteners 695 in fixed relationship between floating extension 410 and anchored fixed extensions 420, with no gap existing between floating extensions 410 and first enclosure side 232 which contact and abut each other when threaded fasteners 695 are tightened as shown in cut-away section of FIG. 11D.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. A method of installing a divider wall assembly within a cavity of a chassis enclosure that is defined between a first side and a second side of the chassis enclosure, the method comprising:

positioning a divider wall of the divider wall assembly within the cavity of the chassis enclosure in perpendicular orientation to a plane of a first side and a second side of the chassis enclosure with at least one floating extension coupled to a first end of the divider wall in retracted position so as to create an open gap between a first end of the divider wall and a first side of the chassis enclosure and so as to create an open gap between a first end of the retracted floating extension and the first side of the chassis enclosure;

positioning at least one fixed extension extending from the second end of the divider wall into a corresponding opening defined in a second side of the chassis enclosure to secure the second end of the divider wall to the second side of the chassis enclosure with the divider wall assembly positioned in perpendicular orientation to the plane of the first side and the second side of the chassis enclosure;

then raising the at least one floating extension to an extended position to contact and secure the first end of the divider wall to the first side of the chassis enclosure with the first end of the divider wall secured to the first side of the chassis enclosure by the floating extension;

where the divider wall further comprises at least one flange extending outward from a side of the second end of the divider wall; where the fixed extension comprises a L-shaped plate that is spaced apart from the flange to form an insertion gap between the flange and the plate; and where the method further comprises:

inserting the plate of the fixed extension through the opening in the second side of the chassis enclosure at the same time that one side of the divider wall assembly is oriented at an acute angle to the second side of the chassis enclosure and then rotating the divider wall assembly into perpendicular orientation to the plane of the first side and the second side of the chassis enclosure to cause the insertion gap to receive the second side of the chassis enclosure between the plate and the flange of the divider wall assembly to prevent the fixed extension from being removed from the opening in the second side of the chassis enclosure to secure the second end of the divider wall to the second side of the chassis enclosure.

2. The method of claim 1, where the step of positioning comprises positioning the divider wall assembly into the chassis cavity such that no contact occurs between the first side of the chassis enclosure and either a first end of the floating extension or the first end of the divider wall when the divider wall assembly is positioned in perpendicular orientation to the plane of the first side and the second side of the chassis enclosure.

3. The method of claim 1, where the floating extension is configured to receive a fastener to secure the first end of the divider wall to the first side of the chassis enclosure after the divider wall assembly is positioned in perpendicular orientation to the plane of the first side and the second side of the chassis enclosure.

4. The method of claim 1, where the floating extension is slidably secured to a side of the divider wall by at least one post extending outwardly from the side of the divider wall through an elongated opening, the floating extension being configured to slide outward and away from first end of the divider wall into the extended position and to slide inward and toward the first end of the divider wall into the retracted position.

5. The method of claim 1, further comprising securing the floating extension to the first side of the chassis enclosure to secure the first end of the divider wall to the first side of the chassis enclosure after the divider wall assembly is positioned in perpendicular orientation to the plane of the first side and the second side of the chassis enclosure.

6. A method of installing a divider wall assembly within a cavity of a chassis enclosure that is defined between a first side and a second side of the chassis enclosure, the method comprising:

positioning a divider wall of the divider wall assembly within the cavity of the chassis enclosure in perpendicular orientation to a plane of a first side and a second side of the chassis enclosure with at least one floating extension coupled to a first end of the divider wall in retracted position so as to create an open gap between a first end of the divider wall and a first side of the chassis enclosure and so as to create an open gap between a first end of the retracted floating extension and the first side of the chassis enclosure;

positioning at least one fixed extension extending from the second end of the divider wall into a corresponding opening defined in a second side of the chassis enclosure to secure the second end of the divider wall to the second side of the chassis enclosure with the divider wall assembly positioned in perpendicular orientation to the plane of the first side and the second side of the chassis enclosure;

then raising the at least one floating extension to an extended position to contact and secure the first end of the divider wall to the first side of the chassis enclosure with the first end of the divider wall secured to the first side of the chassis enclosure by the floating extension;

where the divider wall assembly further comprises two flanges extending outward from opposing sides of the second end of the divider wall; where the fixed extension comprises a T-shaped plate that is spaced apart from the flange to form two opposing insertion gaps on opposite sides of the divider wall assembly, each of the insertion gaps being formed between one of the flanges and the T-shaped plate; and where the method further comprises:

inserting the plate of the fixed extension through the opening defined in the second side of the chassis enclosure at the same time the divider wall assembly is oriented in a perpendicular direction to the plane of the first side and the second side of the chassis enclosure, and then sliding the divider wall assembly longitudinally relative to the second side of the chassis enclosure to cause each of the opposing insertion gaps to receive the second side of the chassis enclosure between one of flanges and the T-shaped plate within a narrowed slot that is defined contiguously with the opening within the second side of the chassis opening at the same time that the divider wall assembly is oriented in a perpendicular position to the plane of the first side and the second side of the chassis enclosure to prevent the fixed extension from being removed from the opening and slot defined in the second side of the chassis enclosure to secure the second end of the divider wall to the second side of the chassis enclosure.

7. The method of claim 6, where the step of positioning comprises positioning the divider wall assembly into the chassis cavity such that no contact occurs between the first side of the chassis enclosure and either a first end of the floating extension or the first end of the divider wall when the divider wall assembly is positioned in perpendicular orientation to the plane of the first side and the second side of the chassis enclosure.

8. The method of claim 6, further comprising securing the floating extension to the first side of the chassis enclosure to secure the first end of the divider wall to the first side of the chassis enclosure after the divider wall assembly is positioned in perpendicular orientation to the plane of the first side and the second side of the chassis enclosure.

9. The method of claim 6, where the floating extension is configured to receive a fastener to secure the first end of the divider wall to the first side of the chassis enclosure after the divider wall assembly is positioned in perpendicular orientation to the plane of the first side and the second side of the chassis enclosure.

10. A chassis enclosure for an information handling system, comprising:
first and second sides defining a chassis enclosure cavity for an information handling system therebetween;
a divider wall assembly disposed within the cavity of the chassis enclosure in perpendicular orientation to a plane of a first side and a second side of the chassis enclosure, the divider wall having a first end and a second end, and a height of the divider wall between the first end and second end of the divider wall being less than a height of the chassis enclosure cavity so as to create an open gap between the first end of the divider wall and the first side of the chassis enclosure; and
at least one floating extension coupled to extend from the first end of the divider wall and configured to freely fall downward due to gravity and remain in a retracted position closer to the first end of the divider wall during insertion of the divider wall assembly into the chassis cavity such that no contact occurs between the first side of the chassis enclosure and either the floating extension or the first end of the divider wall when the divider wall assembly is positioned in perpendicular orientation to the plane of the first side and the second side of the chassis enclosure so that the divider wall assembly is not subjected to compressional forces due to mechanical contact with interior surfaces of the chassis enclosure cavity when the divider wall is inserted and positioned within the cavity of the chassis enclosure;
where the floating extension is raised to its extended position to contact and secure the first end of the divider wall to the first side of the chassis enclosure with the divider wall assembly is positioned in perpendicular orientation to the plane of the first side and the second side of the chassis enclosure; and
where the divider wall assembly further comprises:
at least one fixed extension extending from the second end of the divider wall and configured to be received within a corresponding opening defined in the second side of the chassis enclosure to secure the second end of the divider wall to the second side of the chassis enclosure when the divider wall assembly is positioned in perpendicular orientation to the plane of the first side and the second side of the chassis enclosure with the first end of the divider wall secured to the first side of the chassis enclosure by the floating extension, and
at least one flange extending outward from a side of the second end of the divider wall; where the fixed extension comprises a L-shaped plate that is spaced apart from the flange to form an insertion gap between the flange and the plate; where the plate of the fixed extension is configured to be freely inserted through the opening in the second side of the chassis enclosure when one side of the divider wall assembly is oriented at an acute angle to the second side of the chassis enclosure; where the open gap defined between the first end of the divider wall and a first side of the chassis enclosure when the divider wall is positioned in perpendicular orientation to the plane of a first side and a second side of the chassis enclosure is configured to provide clearance to allow the divider wall assembly to be rotated into perpendicular orientation to the plane of the first side and the second side of the chassis enclosure; and where the insertion gap is configured to receive the second side of the chassis enclosure between the plate and the flange of the divider wall assembly when the one side of the divider wall assembly is rotated into a perpendicular orientation to the plane of the first side and the second side of the chassis enclosure to prevent the fixed extension from being removed from the opening in the second side of the chassis enclosure to secure the second end of the divider wall to the second side of the chassis enclosure.

11. The chassis enclosure of claim 10, where the floating extension is configured to receive a fastener to secure the first end of the divider wall to the first side of the chassis enclosure after the divider wall assembly is positioned in perpendicular orientation to the plane of the first side and the second side of the chassis enclosure.

12. The chassis enclosure of claim 10, where the floating extension is slidably secured to a side of the divider wall by at least one post extending outwardly from the side of the divider wall through an elongated opening, the floating extension being configured to slide outward and away from first end of the divider wall into the extended position and to slide inward and toward the first end of the divider wall into the retracted position.

13. The chassis enclosure of claim 10, where the floating extension is secured to the first side of the chassis enclosure by a removable fastener with the divider wall assembly positioned in perpendicular orientation to the plane of the first side and the second side of the chassis enclosure.

14. A chassis enclosure for an information handling system, comprising:
first and second sides defining a chassis enclosure cavity for an information handling system therebetween;
a divider wall assembly disposed within the cavity of the chassis enclosure in perpendicular orientation to a plane of a first side and a second side of the chassis enclosure, the divider wall having a first end and a second end, and a height of the divider wall between the first end and second end of the divider wall being less than a height of the chassis enclosure cavity so as to create an open gap between the first end of the divider wall and the first side of the chassis enclosure; and
at least one floating extension coupled to extend from the first end of the divider wall and configured to remain in a retracted position closer to the first end of the divider wall during insertion of the divider wall assembly into the chassis cavity such that no contact occurs between the first side of the chassis enclosure and either the floating extension or the first end of the divider wall when the divider wall assembly is positioned in perpendicular orientation to the plane of the first side and the second side of the chassis enclosure;
where the floating extension is raised to its extended position to contact and secure the first end of the divider wall to the first side of the chassis enclosure with the divider wall assembly is positioned in perpendicular orientation to the plane of the first side and the second side of the chassis enclosure; and
where the divider wall assembly further comprises:
at least one fixed extension extending from the second end of the divider wall and configured to be received within a corresponding opening defined in the second side of the chassis enclosure to secure the second end of the divider wall to the second side of the chassis enclosure when the divider wall assembly is positioned in perpendicular orientation to the plane of the first side and the second side of the chassis enclosure with the first end of the divider wall secured to the first side of the chassis enclosure by the floating extension, and two flanges extending outward from opposing sides of the second end of the divider wall; where the fixed extension comprises a T-shaped plate that is spaced apart from the flange to form two opposing insertion gaps on opposite sides of the divider wall assembly, each of the insertion gaps being formed between one of the flanges and the T-shaped plate; where the plate of the fixed extension is configured to be freely inserted through the opening defined in the second side of the chassis enclosure when the divider wall assembly is oriented in a perpendicular direction to the plane of the first side and the second side of the chassis enclosure; and where each of the opposing insertion gaps are configured to receive the second side of the chassis enclosure between one of flanges and the T-shaped plate when the divider wall assembly is slid longitudinally to position the fixed extension within a narrowed slot that is defined contiguously with the opening within the second side of the chassis opening when the divider wall assembly is oriented in a perpendicular position to the plane of the first side and the second side of the chassis enclosure to prevent the fixed extension from being removed from the opening and slot defined in the second side of the chassis enclosure to secure the second end of the divider wall to the second side of the chassis enclosure.

15. A divider wall assembly configured to be received within a cavity of a chassis enclosure in perpendicular orientation to a plane of a first side and a second side of the chassis enclosure that define the chassis enclosure cavity, the divider wall assembly comprising:

a divider wall having a first end and a second end, a height of the divider wall between the first end and second end being less than a height of the chassis enclosure cavity defined between the first side and second side of the chassis enclosure so as to create an open gap between the first end of the divider wall and a first side of the chassis enclosure when the divider wall is positioned in perpendicular orientation to the plane of a first side and a second side of the chassis enclosure; and at least one floating extension coupled to extend from the first end of the divider wall and configured to remain in a retracted position closer to the first end of the divider wall during insertion of the divider wall assembly into the chassis cavity such that no contact occurs between the first side of the chassis enclosure and either the floating extension or the first end of the divider wall when the divider wall assembly is positioned in perpendicular orientation to the plane of the first side and the second side of the chassis enclosure;

where the floating extension is configured to be raised to its extended position to contact and secure the first end of the divider wall to the first side of the chassis enclosure after the divider wall assembly is positioned in perpendicular orientation to the plane of the first side and the second side of the chassis enclosure;

where the divider wall assembly further comprises:

at least one fixed extension extending from the second end of the divider wall and configured to be received within a corresponding opening defined in a second side of the chassis enclosure to secure the second end of the divider wall to the second side of the chassis enclosure when the divider wall assembly is positioned in perpendicular orientation to the plane of the first side and the second side of the chassis enclosure with the first end of the divider wall secured to the first side of the chassis enclosure by the floating extension, and at least one flange extending outward from a side of the second end of the divider wall; where the fixed extension comprises a L-shaped plate that is spaced apart from the flange to form an insertion gap between the flange and the plate; where the plate of the fixed extension is configured to be freely inserted through the opening in the second side of the chassis enclosure when one side of the divider wall assembly is oriented at an acute angle to the second side of the chassis enclosure; where the open gap defined between the first end of the divider wall and a first side of the chassis enclosure when the divider wall is positioned in perpendicular orientation to the plane of a first side and a second side of the chassis enclosure is configured to provide clearance to allow the divider wall assembly to be rotated into perpendicular orientation to the plane of the first side and the second side of the chassis enclosure; and where the insertion gap is configured to receive the second side of the chassis enclosure between the plate and the flange of the divider wall assembly when the one side of the divider wall assembly is rotated into a perpendicular orientation to the plane of the first side and the second side of the chassis enclosure to prevent the fixed extension from being removed from the opening in the second side of the chassis enclosure to secure the second end of the divider wall to the second side of the chassis enclosure.

16. The divider wall assembly of claim 15, where the floating extension is configured to receive a fastener to secure the first end of the divider wall to the first side of the chassis enclosure after the divider wall assembly is positioned in perpendicular orientation to the plane of the first side and the second side of the chassis enclosure.

17. The divider wall assembly of claim 15, where the floating extension is slidably secured to a side of the divider wall by at least one post extending outwardly from the side of the divider wall through an elongated opening, the floating extension being configured to slide outward and away from first end of the divider wall into the extended position and to slide inward and toward the first end of the divider wall into the retracted position.

18. A divider wall assembly configured to be received within a cavity of a chassis enclosure in perpendicular orientation to a plane of a first side and a second side of the chassis enclosure that define the chassis enclosure cavity, the divider wall assembly comprising:

a divider wall having a first end and a second end, a height of the divider wall between the first end and second end being less than a height of the chassis enclosure cavity defined between the first side and second side of the chassis enclosure so as to create an open gap between the first end of the divider wall and a first side of the chassis enclosure when the divider wall is positioned in perpendicular orientation to the plane of a first side and a second side of the chassis enclosure; and at least one floating extension coupled to extend from the first end of the divider wall and configured to remain in a retracted position closer to the first end of the divider wall during insertion of the divider wall assembly into the chassis cavity such that no contact occurs between the first side of the chassis enclosure and either the floating extension or the first end of the divider wall when the divider wall assembly is positioned in perpendicular orientation to the plane of the first side and the second side of the chassis enclosure;

where the floating extension is configured to be raised to its extended position to contact and secure the first end of the divider wall to the first side of the chassis enclosure after the divider wall assembly is positioned in perpendicular orientation to the plane of the first side and the second side of the chassis enclosure;

where the divider wall assembly further comprises:
   at least one fixed extension extending from the second end of the divider wall and configured to be received within a corresponding opening defined in a second side of the chassis enclosure to secure the second end of the divider wall to the second side of the chassis enclosure when the divider wall assembly is positioned in perpendicular orientation to the plane of the first side and the second side of the chassis enclosure with the first end of the divider wall secured to the first side of the chassis enclosure by the floating extension, and
   two flanges extending outward from opposing sides of the second end of the divider wall; where the fixed extension comprises a T-shaped plate that is spaced apart from the flange to form two opposing insertion gaps on opposite sides of the divider wall assembly, each of the insertion gaps being formed between one of the flanges and the T-shaped plate; where the plate of the fixed extension is configured to be freely inserted through the opening defined in the second side of the chassis enclosure when the divider wall assembly is oriented in a perpendicular direction to the plane of the first side and the second side of the chassis enclosure; and where each of the opposing insertion gaps are configured to receive the second side of the chassis enclosure between one of flanges and the T-shaped plate when the divider wall assembly is slid longitudinally to position the fixed extension within a narrowed slot that is defined contiguously with the opening within the second side of the chassis opening when the divider wall assembly is oriented in a perpendicular position to the plane of the first side and the second side of the chassis enclosure to prevent the fixed extension from being removed from the opening and slot defined in the second side of the chassis enclosure to secure the second end of the divider wall to the second side of the chassis enclosure.

19. The divider wall assembly of claim 18, where the floating extension is configured to receive a fastener to secure the first end of the divider wall to the first side of the chassis enclosure after the divider wall assembly is positioned in perpendicular orientation to the plane of the first side and the second side of the chassis enclosure.

20. The divider wall assembly of claim 18, where the floating extension is slidably secured to a side of the divider wall by at least one post extending outwardly from the side of the divider wall through an elongated opening, the floating extension being configured to slide outward and away from first end of the divider wall into the extended position and to slide inward and toward the first end of the divider wall into the retracted position.

* * * * *